United States Patent
Hasegawa et al.

(10) Patent No.: US 11,444,010 B2
(45) Date of Patent: Sep. 13, 2022

(54) SEMICONDUCTOR DEVICE

(71) Applicant: RENESAS ELECTRONICS CORPORATION, Tokyo (JP)

(72) Inventors: Kazunori Hasegawa, Tokyo (JP); Yuichi Yato, Tokyo (JP); Hiroyuki Nakamura, Tokyo (JP); Yukihiro Sato, Tokyo (JP); Hiroya Shimoyama, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 28 days.

(21) Appl. No.: 17/060,545

(22) Filed: Oct. 1, 2020

(65) Prior Publication Data

US 2021/0118781 A1 Apr. 22, 2021

(30) Foreign Application Priority Data

Oct. 21, 2019 (JP) .............................. JP2019-192015

(51) Int. Cl.
*H01L 23/495* (2006.01)
*H01L 23/48* (2006.01)
(Continued)

(52) U.S. Cl.
CPC .... *H01L 23/49575* (2013.01); *H01L 23/3107* (2013.01); *H01L 23/4952* (2013.01);
(Continued)

(58) Field of Classification Search
CPC ........... H01L 23/49575; H01L 23/3107; H01L 23/49513; H01L 23/4952; H01L 23/49524;
(Continued)

(56) References Cited

U.S. PATENT DOCUMENTS 6,319,755 B1  11/2001  Mauri
6,465,276 B2 * 10/2002  Kuo ..................... H01L 23/051
                                                          438/110
(Continued)

FOREIGN PATENT DOCUMENTS

EP      2 575 172 A2    4/2013
JP      2018-121035 A   8/2018

OTHER PUBLICATIONS

Extended European Search Report issued in corresponding European Patent Application No. 20202651.4-1211, dated Mar. 16, 2021.

*Primary Examiner* — Alonzo Chambliss
(74) *Attorney, Agent, or Firm* — McDermott Will & Emery LLP

(57) ABSTRACT

A semiconductor device includes: a semiconductor chip including a field effect transistor for switching; a die pad on which the semiconductor chip is mounted via a first bonding material; a lead electrically connected to a pad for source of the semiconductor chip through a metal plate; a lead coupling portion formed integrally with the lead; and a sealing portion for sealing them. A back surface electrode for drain of the semiconductor chip and the die pad are bonded via the first bonding material, the metal plate and the pad for source of the semiconductor chip are bonded via a second bonding material, and the metal plate and the lead coupling portion are bonded via a third bonding material. The first, second, and third bonding materials have conductivity, and an elastic modulus of each of the first and second bonding materials is lower than that of the third bonding material.

20 Claims, 24 Drawing Sheets

(51) Int. Cl.
  *H01L 21/00* (2006.01)
  *H05K 7/02* (2006.01)
  *H05K 7/18* (2006.01)
  *H01L 23/31* (2006.01)
  *H01L 23/00* (2006.01)

(52) U.S. Cl.
  CPC .. *H01L 23/49513* (2013.01); *H01L 23/49524* (2013.01); *H01L 23/49562* (2013.01); *H01L 23/49568* (2013.01); *H01L 23/562* (2013.01); *H01L 24/06* (2013.01); *H01L 24/37* (2013.01); *H01L 24/40* (2013.01); *H01L 2924/1306* (2013.01); *H01L 2924/181* (2013.01)

(58) Field of Classification Search
  CPC ......... H01L 23/49562; H01L 23/49568; H01L 23/562; H01L 24/32; H01L 21/56; H01L 24/83; H01L 24/37; H01L 24/84; H01L 24/41; H01L 2924/181; H01L 2924/1306; H01L 24/29; H01L 24/06; H01L 24/40
  See application file for complete search history.

(56) References Cited

U.S. PATENT DOCUMENTS

| | | | |
|---|---|---|---|
| 6,723,582 B2* | 4/2004 | Glenn | H01L 23/49524 438/107 |
| 6,849,930 B2* | 2/2005 | Nakajima | H01L 23/49524 257/666 |
| 7,230,322 B2* | 6/2007 | Funato | H01L 24/40 257/666 |
| 8,299,600 B2* | 10/2012 | Sato | H01L 24/40 257/692 |
| 8,304,903 B2* | 11/2012 | Herbsommer | H01L 23/49562 257/E23.07 |
| 8,643,185 B2 | 2/2014 | Kajiwara et al. | |
| 9,059,153 B2* | 6/2015 | Fukui | H01L 23/49524 |
| 10,204,849 B2 | 2/2019 | Nakamura et al. | |
| 10,811,344 B2* | 10/2020 | Tsukuda | H01L 23/49531 |
| 2008/0197492 A1* | 8/2008 | Mizutani | H05K 3/4007 257/737 |
| 2009/0014871 A1* | 1/2009 | Meyer | H01L 24/11 257/737 |
| 2013/0043576 A1* | 2/2013 | Nakamura | H01L 24/06 257/676 |
| 2013/0082334 A1* | 4/2013 | Nakamura | H01L 27/088 257/401 |
| 2013/0207252 A1 | 8/2013 | Muto et al. | |
| 2013/0256894 A1* | 10/2013 | Adema | H01L 24/29 257/762 |
| 2014/0103510 A1* | 4/2014 | Andou | H01L 24/89 257/676 |
| 2018/0331013 A1* | 11/2018 | Hine | H01L 23/15 |

\* cited by examiner

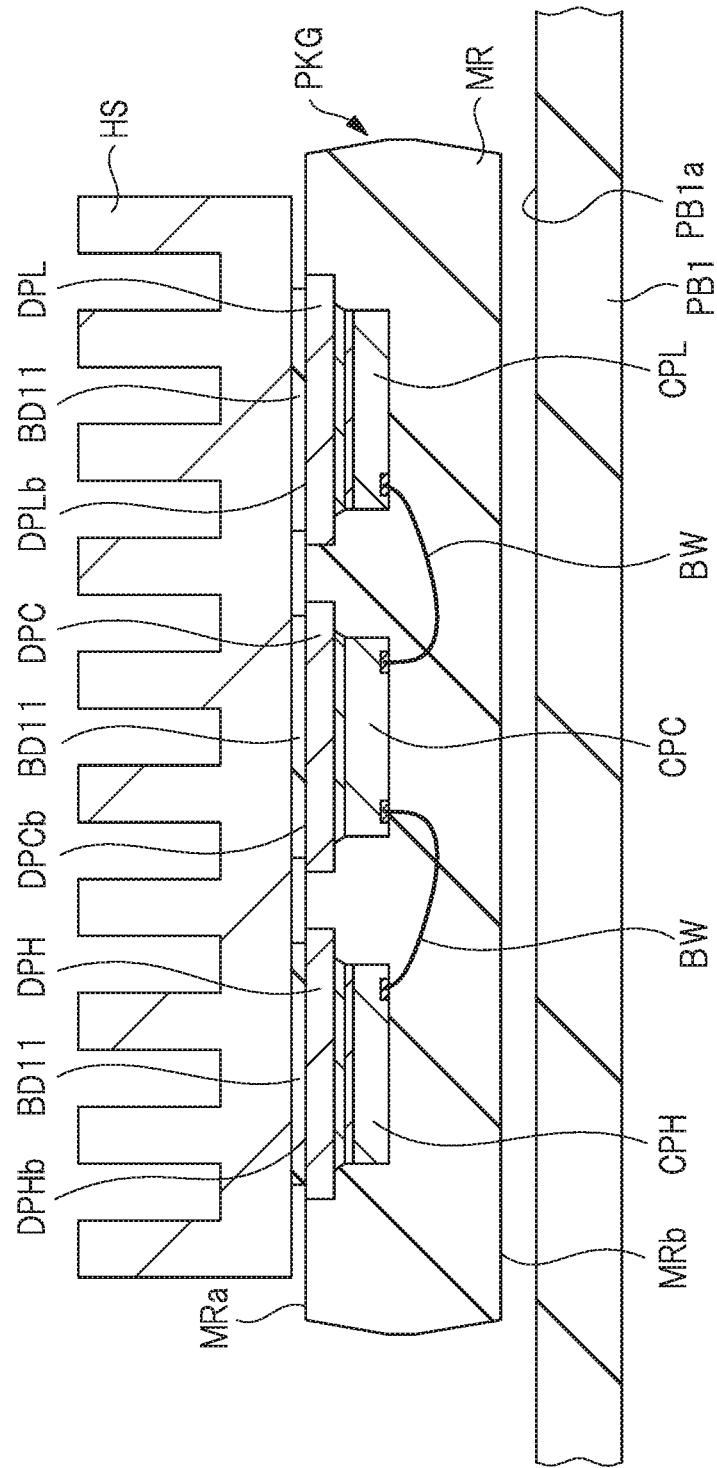

FIG. 31

|  | LOW-ELASTIC BONDING MATERIAL | HIGH-ELASTIC BONDING MATERIAL |
|---|---|---|
| SILVER CONTENT | LOW | HIGH |
| ELASTIC MODULUS | LOW | HIGH |
| THERMAL CONDUCTIVITY | LOW | HIGH |
| VOLUME RESISTIVITY | HIGH | LOW |

FIG. 32

| BONDING MATERIAL | FIRST EMBODIMENT | SECOND EMBODIMENT |
|---|---|---|
| BD1 | LOW-ELASTIC BONDING MATERIAL | LOW-ELASTIC BONDING MATERIAL |
| BD2 | LOW-ELASTIC BONDING MATERIAL | LOW-ELASTIC BONDING MATERIAL |
| BD3 | LOW-ELASTIC BONDING MATERIAL | LOW-ELASTIC BONDING MATERIAL |
| BD4 | LOW-ELASTIC BONDING MATERIAL | HIGH-ELASTIC BONDING MATERIAL |
| BD5 | HIGH-ELASTIC BONDING MATERIAL | HIGH-ELASTIC BONDING MATERIAL |
| BD6 | LOW-ELASTIC BONDING MATERIAL | HIGH-ELASTIC BONDING MATERIAL |
| BD7 | HIGH-ELASTIC BONDING MATERIAL | HIGH-ELASTIC BONDING MATERIAL |

SEMICONDUCTOR DEVICE

CROSS-REFERENCE TO RELATED APPLICATION

The disclosure of Japanese Patent Application No. 2019-192015 filed on Oct. 21, 2019 including the specification, drawings and abstract is incorporated herein by reference in its entirety.

TECHNICAL FIELD OF THE INVENTION

The present invention relates to a semiconductor device, and can be suitably used for, for example, a semiconductor device in which a semiconductor chip including a field effect transistor for switching is sealed.

BACKGROUND OF THE INVENTION

An inverter circuit widely used as an example of a power supply circuit has a configuration in which a power MOSFET for high side switch and a power MOSFET for low side switch are connected in series between a terminal to which a power supply voltage is supplied and a terminal to which a ground voltage is supplied. By controlling a gate voltage of the power MOSFET for high side switch and a gate voltage of the power MOSFET for low side switch by a control circuit, the power supply voltage can be converted by the inverter circuit.

Patent Document 1 discloses a technology relating to a semiconductor device in which a semiconductor chip including a power MOSFET for high side switch, a semiconductor chip including a power MOSFET for low side switch, and a semiconductor chip for controlling them are sealed.

There are disclosed techniques listed below.

[Patent Document 1] Japanese Unexamined Patent Application Publication No. 2018-121035

SUMMARY OF THE INVENTION

It is desired to improve the reliability of the semiconductor device in which a semiconductor chip including a field effect transistor for switching is sealed.

Other objects and novel features will be apparent from the descriptions of the specification and the accompanying drawings.

According to an embodiment, a semiconductor device includes: a first semiconductor chip including a first field effect transistor for switching; a first chip mounting portion on which the first semiconductor chip is mounted via a first bonding material; a first lead electrically connected to a first pad for source of the first semiconductor chip through a first metal plate; a first metal portion formed integrally with the first lead; and a sealing body for sealing them. A first back surface electrode for drain of the first semiconductor chip and the first chip mounting portion are bonded via the first bonding material, the first metal plate and the first pad for source of the first semiconductor chip are bonded via a second bonding material, and the first metal plate and the first metal portion are bonded via a third bonding material. The first bonding material, the second bonding material, and the third bonding material have conductivity. An elastic modulus of each of the first bonding material and second bonding material is lower than that of the third bonding material.

According to an embodiment, it is possible to improve the reliability of the semiconductor device.

BRIEF DESCRIPTIONS OF THE DRAWINGS

FIG. 30 is a cross-sectional view showing the mounting example of the semiconductor device according to the embodiment;

FIG. 31 is a table in which characteristics of a low-elastic bonding material and a high-elastic bonding material are summarized for comparison; and FIG. 32 is a table in which the bonding materials in each of the embodiment and another embodiment are summarized.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference signs throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

Further, in this application, a field effect transistor is described as MOSFET (Metal Oxide Semiconductor Field Effect Transistor) or simply MOS, but this does not mean that non-oxide film is excluded as a gate insulating film. Namely, when mentioning MOSFET in this application, the MOSFET includes not only the MISFET (Metal Insulator Semiconductor Field Effect Transistor) using an oxide film (silicon oxide film) for a gate insulating film but also the MISFET using an insulating film other than an oxide film (silicon oxide film) for a gate insulating film.

First Embodiment

<Circuit Configuration>

Figure 1:
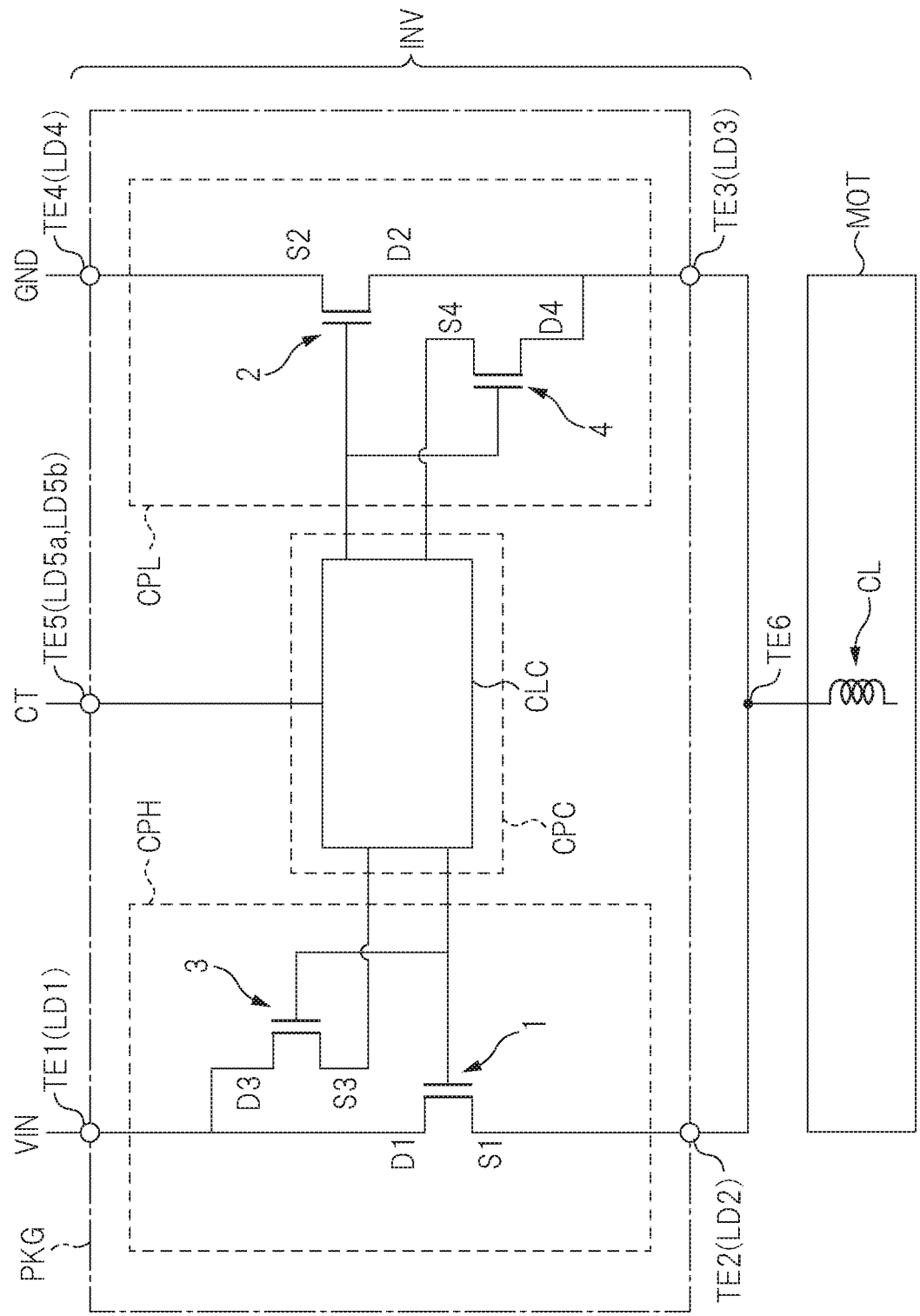
FIG. 1 is a circuit diagram showing an inverter circuit using a semiconductor device according to an embodiment.

FIG. 1 is a circuit diagram showing an example of an electronic device using a semiconductor device (semiconductor package) PKG according to this embodiment, and a circuit diagram in the case where an inverter circuit INV is configured by using the semiconductor device PKG is shown here. In FIG. 1, a part enclosed by a dotted line denoted by CPH is formed in a semiconductor chip CPH, a part enclosed by a dotted line denoted by CPL is formed in a semiconductor chip CPL, a part enclosed by a dotted line denoted by CPC is formed in a semiconductor chip CPC, and a part enclosed by a one-dot chain line denoted by PKG is formed in the semiconductor device PKG.

The semiconductor device PKG used in the inverter circuit INV shown in FIG. 1 includes two power MOSFETs 1 and 2, a sense MOSFET 3 for sensing a current flowing in the power MOSFET 1, a sense MOSFET 4 for sensing a current flowing in the power MOSFET 2, and a control circuit CLC. The control circuit CLC is formed in the semiconductor chip (control semiconductor chip) CPC, the power MOSFET 1 and the sense MOSFET 3 are formed in the semiconductor chip (high-side semiconductor chip, power chip) CPH, and the power MOSFET 2 and the sense MOSFET 4 are formed in the semiconductor chip (low-side semiconductor chip, power chip) CPL. Then, these three semiconductor chips CPC, CPH, and CPL are sealed as the same package, thereby forming the semiconductor device PKG.

The control circuit CLC includes a high-side driver circuit that controls a gate potential of the power MOSFET 1 and a low-side driver circuit that controls a gate potential of the power MOSFET 2. The control circuit CLC is a circuit configured to control the operations of the power MOSFETs 1 and 2 by controlling the respective gate potentials of the power MOSFETs 1 and 2 in accordance with the signals supplied from a control circuit CT outside the semiconductor device PKG to the control circuit CLC.

A gate of the power MOSFET 1 is connected to the high-side driver circuit of the control circuit CLC and a gate of the power MOSFET 2 is connected to the low-side driver circuit of the control circuit CLC. A drain D1 of the power MOSFET 1 is connected to a terminal TE1, a source S1 of the power MOSFET 1 is connected to a terminal TE2, a drain D2 of the power MOSFET 2 is connected to a terminal TE3, and a source S2 of the power MOSFET 2 is connected to a terminal TE4. The control circuit CLC is connected to a terminal TE5, and the terminal TE5 is connected to the control circuit CT provided outside the semiconductor device PKG. The terminals TE1, TE2, TE3, TE4, and TE5 are all external connection terminals of the semiconductor device PKG and are formed of leads LD described later. The terminal TE1 is a terminal to which a power supply potential (VIN) is supplied and the terminal TE4 is a terminal to which a reference potential lower than the power supply potential, for example, ground potential (GND) is supplied. The terminal TE2 and the terminal TE3 are electrically connected outside the semiconductor device PKG. Therefore, the power MOSFET 1 and the power MOSFET 2 are connected in series between the terminal TE1 for supplying power supply potential and the terminal TE4 for supplying reference potential.

A connection point TE6 between the source S1 of the power MOSFET 1 and the drain D1 of the power MOSFET 2 is provided outside the semiconductor device PKG (for example, on a wiring board on which the semiconductor device PKG is mounted), and the connection point TE6 is connected to a load (coil CL of a motor MOT in this case). A DC power supplied to the inverter circuit INV using the semiconductor device PKG is converted into an AC power by the inverter circuit INV and is then supplied to the load (coil CL of the motor MOT in this case).

The power MOSFET 1 corresponds to the field effect transistor for high side switch (high-potential-side switch) and the power MOSFET 2 corresponds to the field effect transistor for low side switch (low-potential-side switch). Each of the power MOSFETs 1 and 2 can be regarded as a power transistor for switching.

The current flowing in the power MOSFET 1 is sensed by the sense MOSFET 3 and the power MOSFET 1 is controlled in accordance with the current flowing in the sense MOSFET 3. Also, the current flowing in the power MOSFET 2 is sensed by the sense MOSFET 4 and the power MOSFET 2 is controlled in accordance with the current flowing in the sense MOSFET 4.

A drain D3 of the sense MOSFET 3 is electrically connected to the drain D1 of the power MOSFET 1 and a gate of the sense MOSFET 3 is electrically connected to the gate of the power MOSFET 1. A source S3 of the sense MOSFET 3 is connected to the control circuit CLC. A drain D4 of the sense MOSFET 4 is electrically connected to the drain D2 of the power MOSFET 2 and a gate of the sense MOSFET 4 is electrically connected to the gate of the power MOSFET 2. A source S4 of the sense MOSFET 4 is connected to the control circuit CLC.

<Structure of Semiconductor Device>

Figure 2:
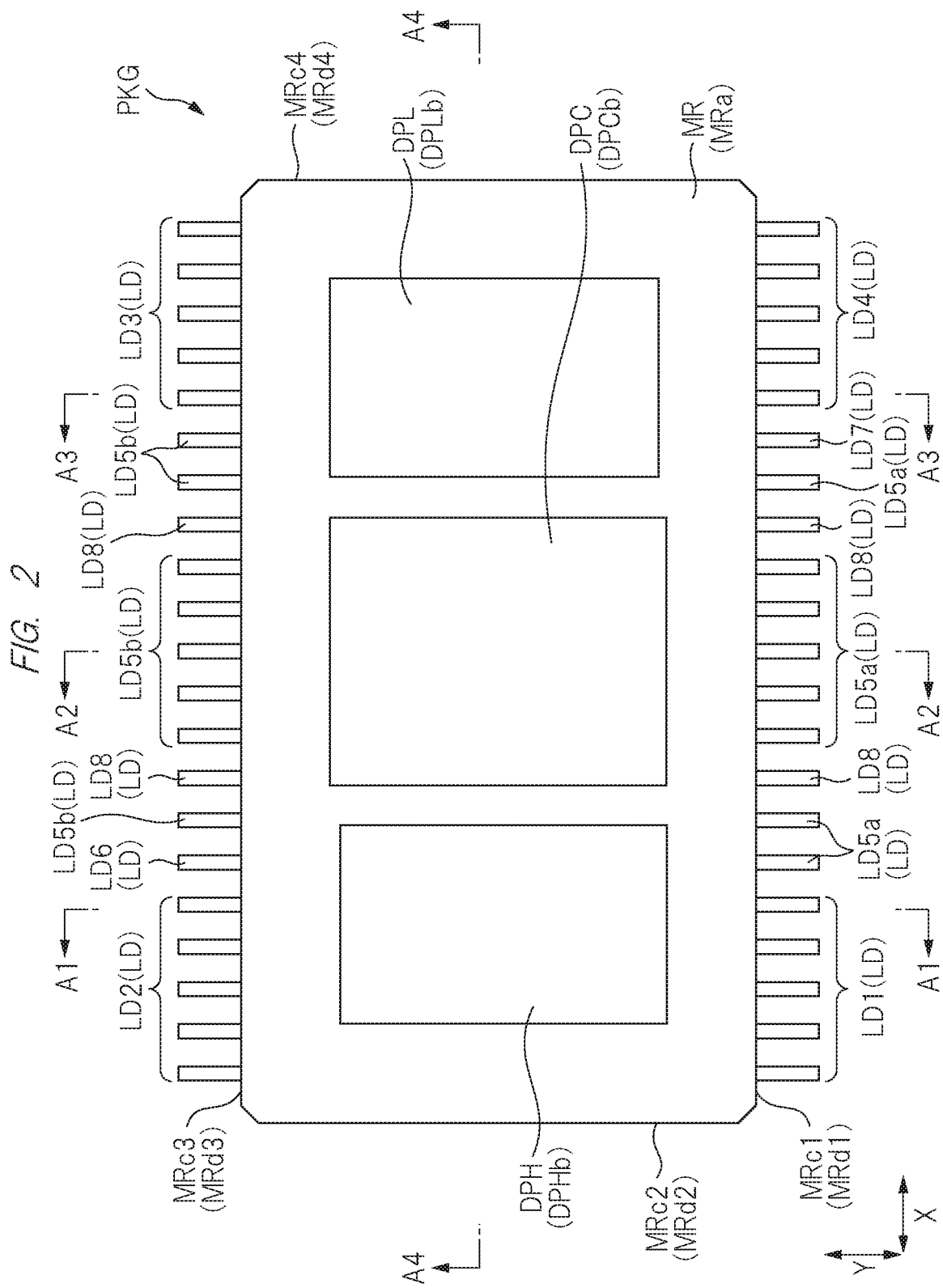
FIG. 2 is a top view of the semiconductor device according to the embodiment.
Figure 3:
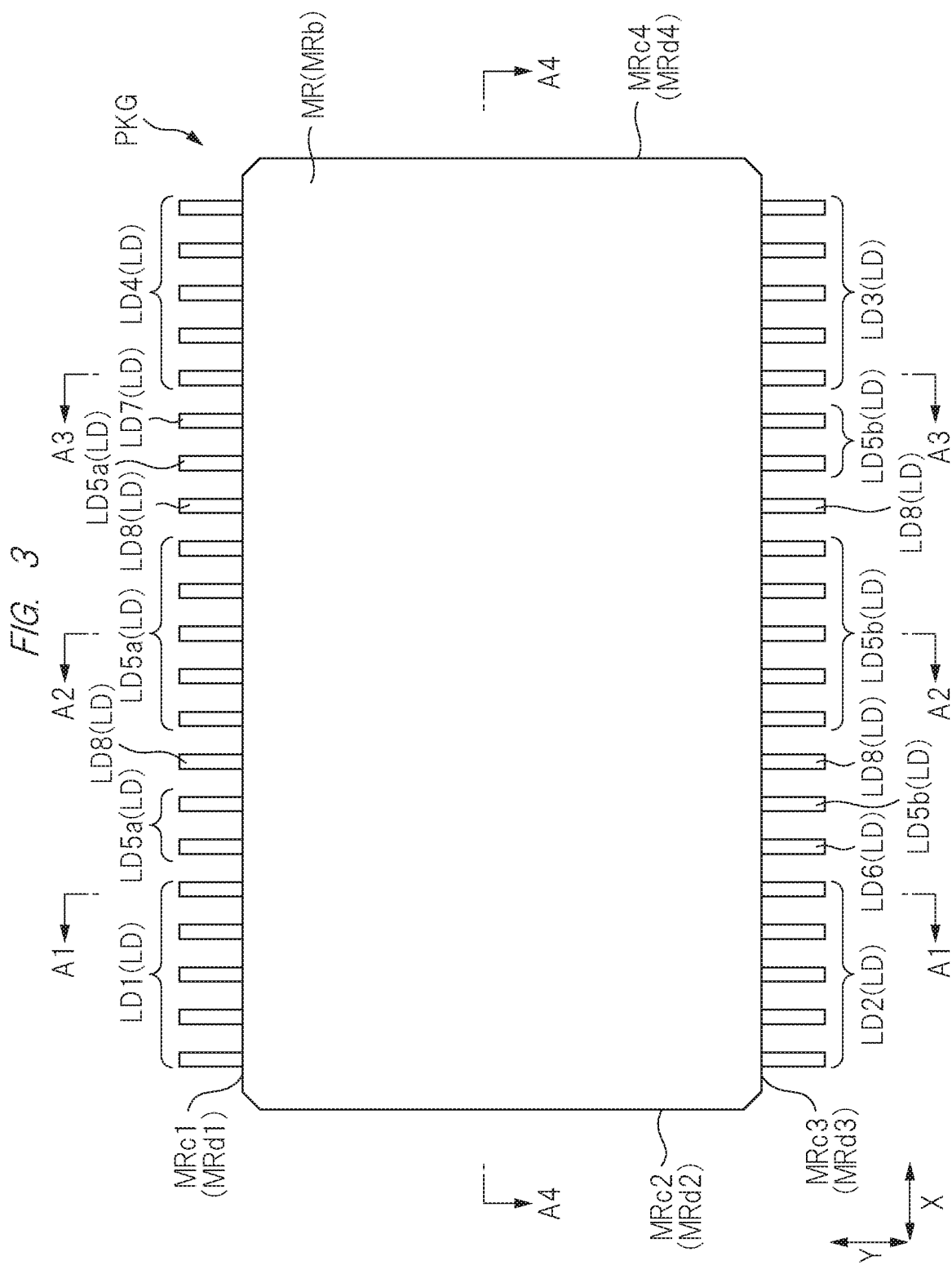
FIG. 3 is a bottom view of the semiconductor device according to the embodiment.
Figure 4:
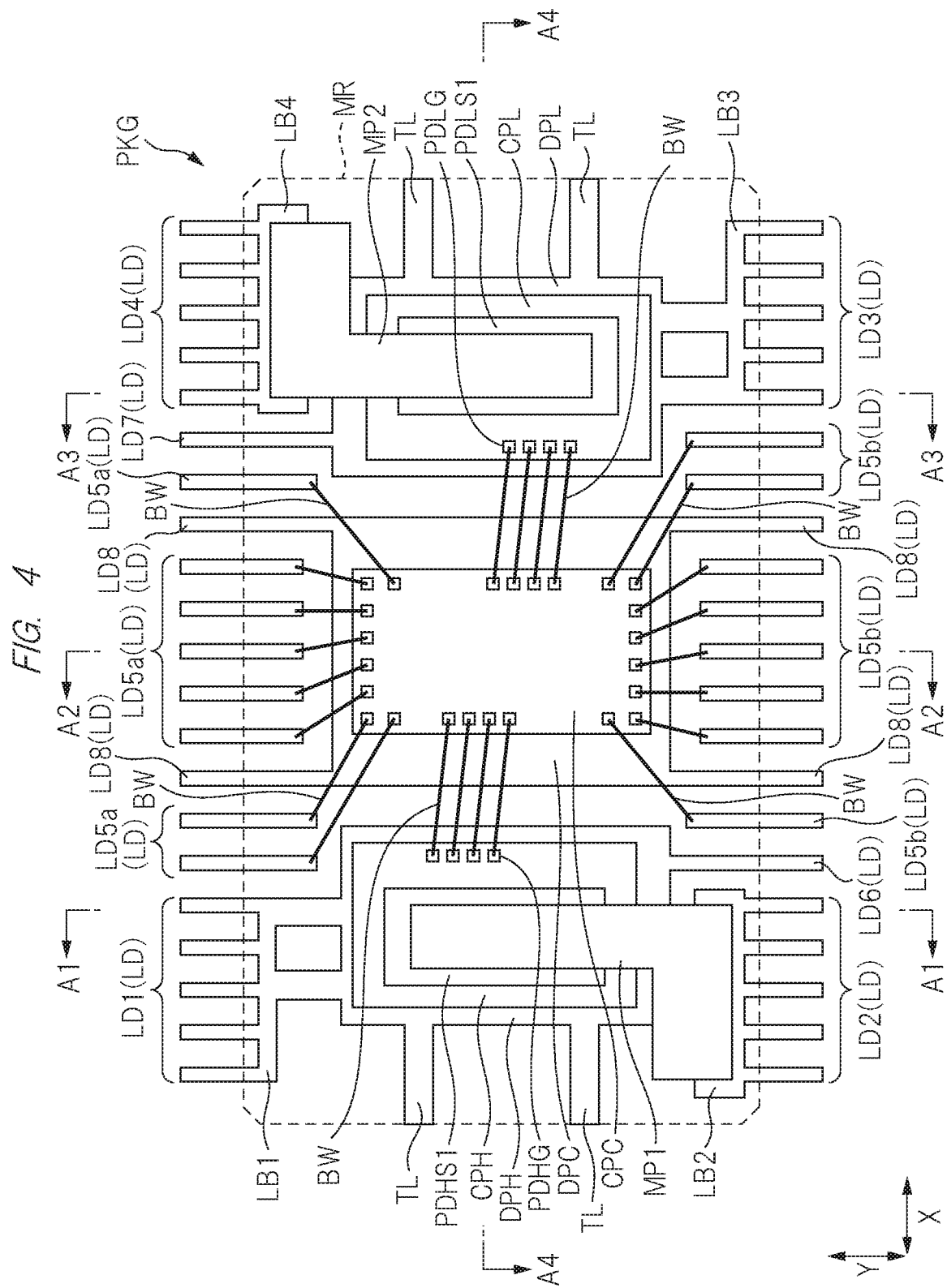
FIG. 4 is a plan transparent view of the semiconductor device according to the embodiment.
Figure 5:
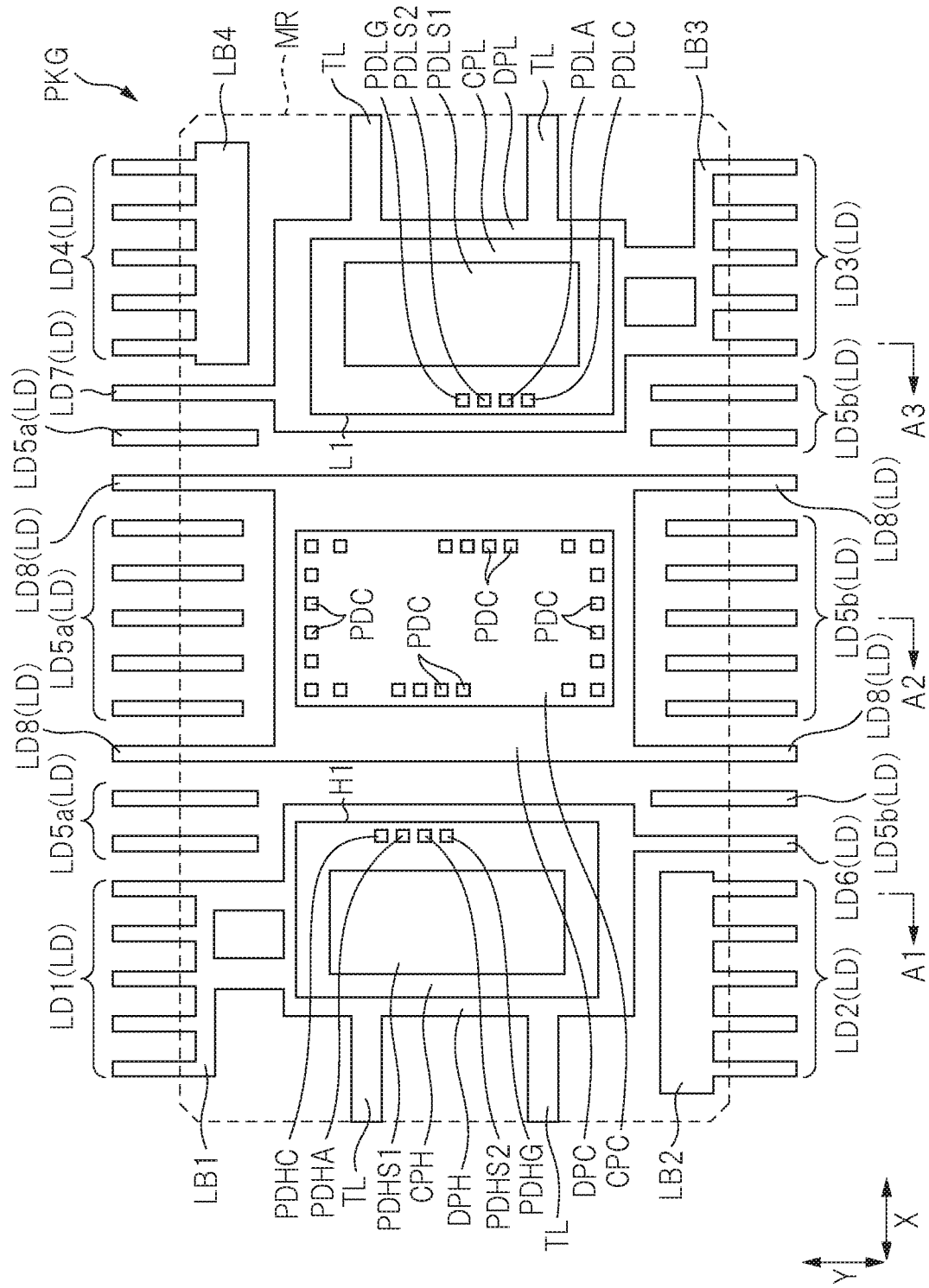
FIG. 5 is a plan transparent view of the semiconductor device according to the embodiment.
Figure 6:
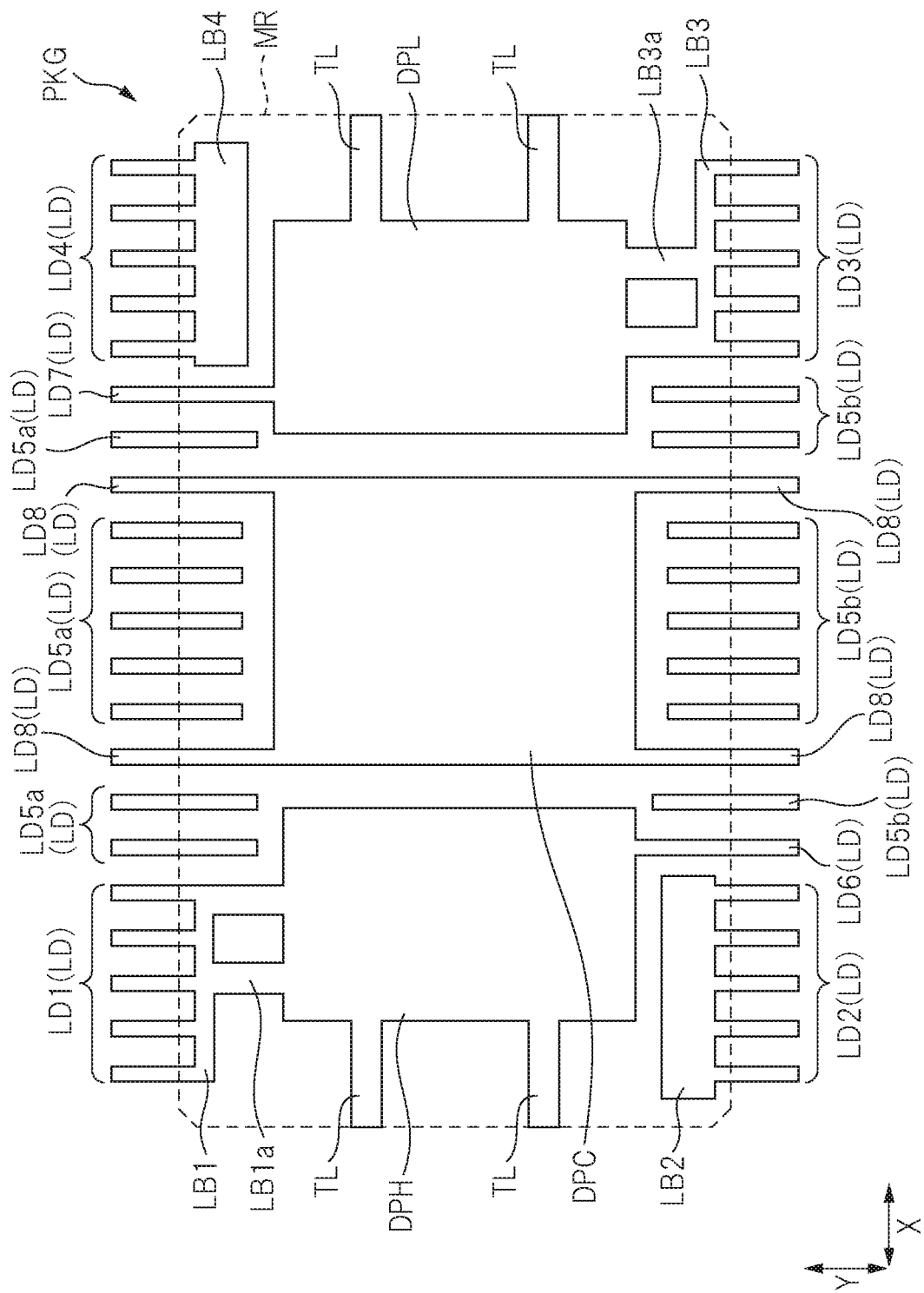
FIG. 6 is a plan transparent view of the semiconductor device according to the embodiment.
Figure 7:
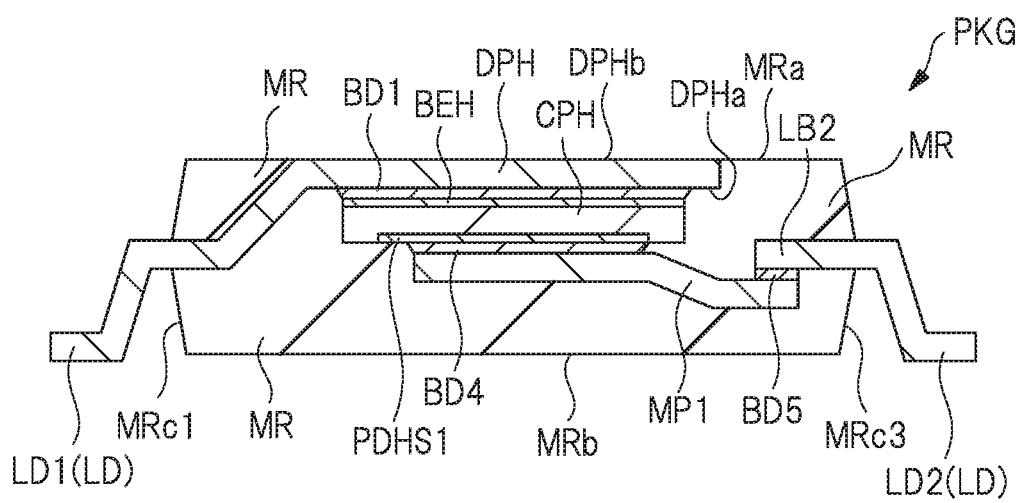
FIG. 7 is a cross-sectional view of the semiconductor device according to the embodiment.
Figure 8:
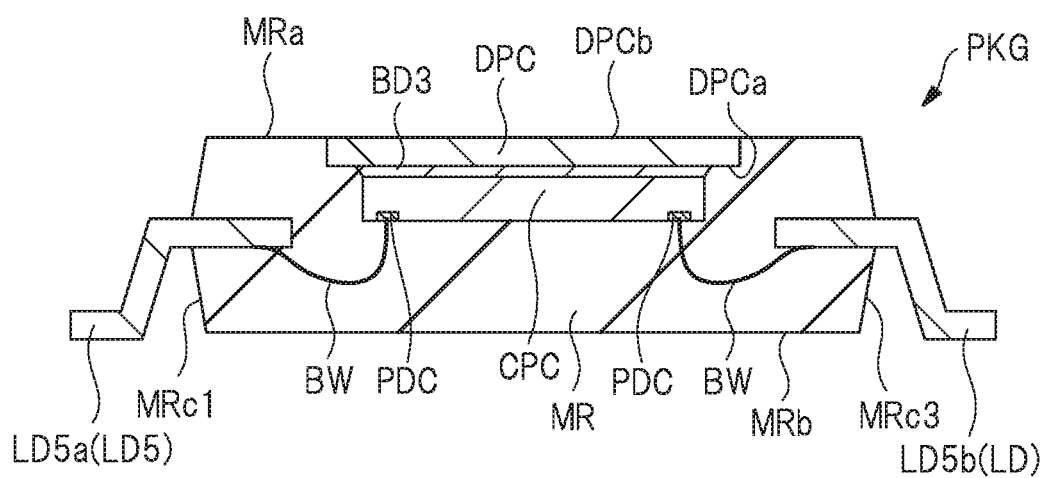
FIG. 8 is a cross-sectional view of the semiconductor device according to the embodiment.
Figure 9:
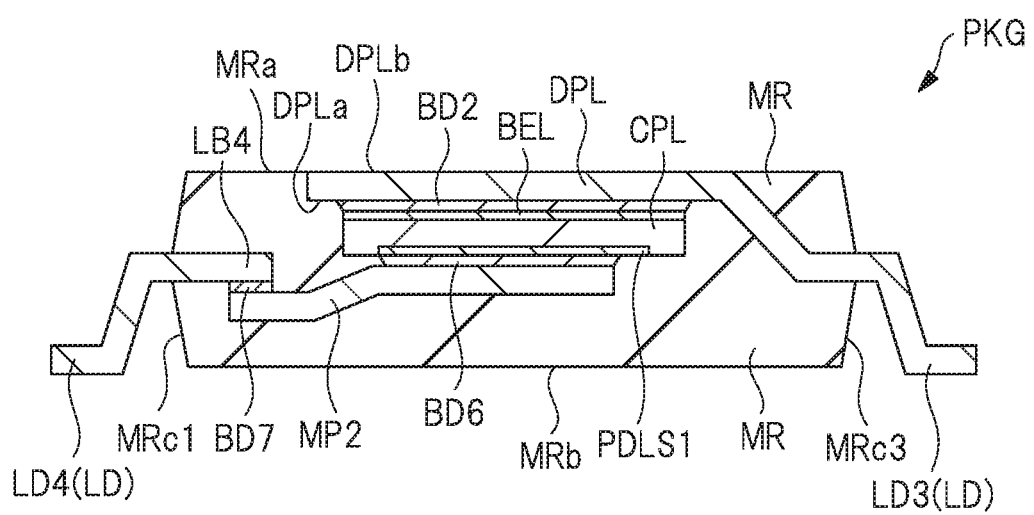
FIG. 9 is a cross-sectional view of the semiconductor device according to the embodiment.
Figure 10:
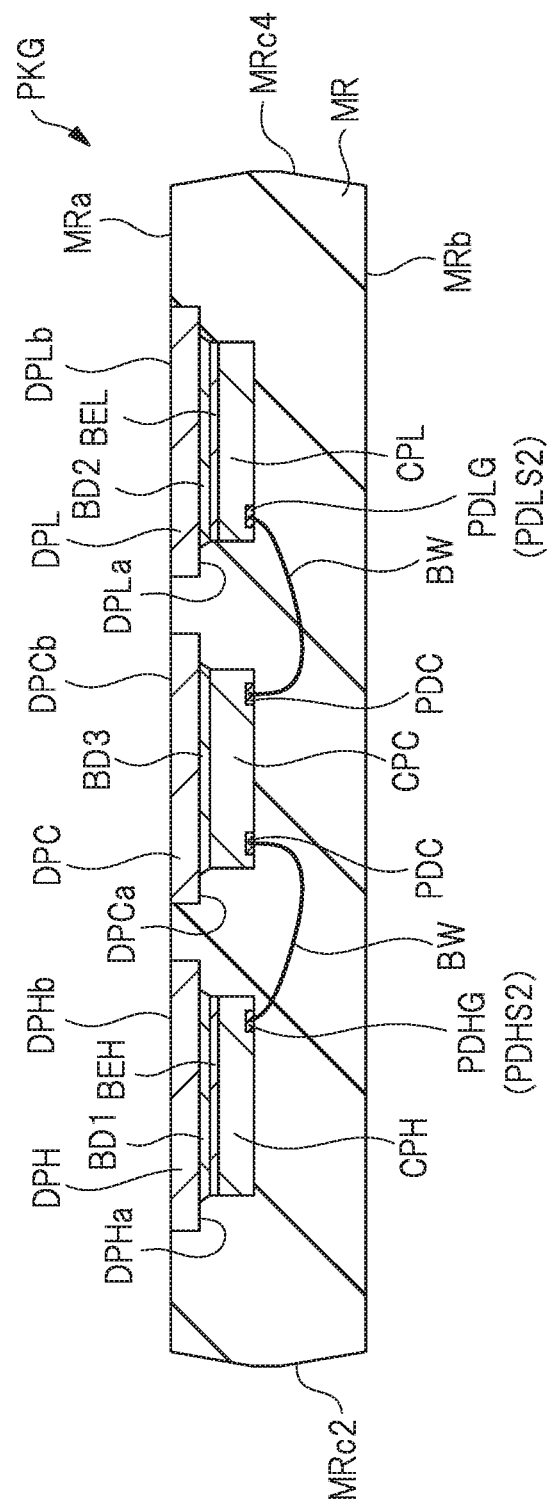
FIG. 10 is a cross-sectional view of the semiconductor device according to the embodiment.

FIG. 2 is a top view of the semiconductor device PKG according to this embodiment, FIG. 3 is a bottom view (back-side view) of the semiconductor device PKG, FIGS. 4 to 6 are plan transparent views of the semiconductor device PKG, and FIGS. 7 to 10 are cross-sectional views of the semiconductor device PKG. FIG. 4 shows a plan transparent view in which the semiconductor device PKG is seen from a lower-surface side through a sealing portion MR. Also, FIG. 5 shows a plan transparent view on a lower-surface side of the semiconductor device PKG in which the semiconductor device PKG is seen through (while omitting) further wires BW and metal plates MP1 and MP2 in FIG. 4. In addition, FIG. 6 shows a plan transparent view on a lower-surface side of the semiconductor device PKG in which the semiconductor device PKG is seen through (while omitting) further the semiconductor chips CPC, CPH, and CPL in FIG. 5. In FIGS. 3 to 6, the semiconductor device PKG has the same orientation. Further, in FIGS. 4 to 6, the position of the outer circumference of the sealing portion MR is indicated by a dotted line. The cross section of the semiconductor device PKG at the position of a line A1-A1 in FIGS. 2 to 4 almost corresponds to FIG. 7, the cross section of the semiconductor device PKG at the position of a line A2-A2 in FIGS. 2 to 4 almost corresponds to FIG. 8, the cross section of the semiconductor device PKG at the position of a line A3-A3 in FIGS. 2 to 4 almost corresponds to FIG. 9, and the cross section of the semiconductor device PKG at the position of a line A4-A4 in FIGS. 2 to 4 almost corresponds to FIG. 10. Note that a reference sign X shown in each plan view indicates a first direction (hereinafter, referred to as X direction) and a reference sign Y indicates a second direction (hereinafter, referred to as Y direction) orthogonal to the first direction X. Namely, the X direction and the Y direction are directions orthogonal to each other.

The semiconductor device (semiconductor package) PKG according to this embodiment shown in FIGS. 2 to 10 is a semiconductor device of the resin-sealed semiconductor package type and is a semiconductor device of the SOP (Small Outline Package) type in this case. The configuration of the semiconductor device PKG will be described below with reference to FIGS. 2 to 10.

The semiconductor device PKG according to this embodiment shown in FIGS. 2 to 10 includes die pads (chip mounting portions) DPC, DPH, and DPL, the semiconductor chips CPC, CPH, and CPL mounted on the main surfaces of the die pads DPC, DPH, and DPL, the metal plates MP1 and MP2, a plurality of wires (bonding wires) BW, a plurality of leads LD, and the sealing portion (sealing body) MR that seals them.

The sealing portion MR as a resin sealing portion (resin sealing body) is made of a resin material such as a thermosetting resin material and can contain filler or the like. For example, the sealing portion MR can be formed by using epoxy resin containing filler. In addition to the epoxy-based resin, for example, biphenyl-based thermosetting resin to which a phenol-based curing agent, silicone rubber, filler, or others is added may be used as the material of the sealing portion MR for the purpose of reducing stress.

The sealing portion MR has a main surface (upper surface) MRa, a back surface (lower surface, bottom surface) MRb on a side opposite to the main surface MRa, and side surfaces MRc1, MRc2, MRc3, and MRc4 intersecting the main surface MRa and the back surface MRb. Namely, the outer appearance of the sealing portion MR is a thin-plate shape surrounded by the main surface MRa, the back surface MRb, and the side surfaces MRc1, MRc2, MRc3, and MRc4. Of the side surfaces MRc1, MRc2, MRc3, and MRc4 of the sealing portion MR, the side surfaces MRc1 and the side surface MRc3 are located on the sides opposite to each other, the side surfaces MRc2 and the side surface MRc4 are located on the sides opposite to each other, the side surface MRc1, the side surface MRc2, and the side surface MRc4 intersect each other, and the side surface MRc3, the side surface MRc2, and the side surface MRc4 intersect each other. The side surfaces MRc1 and MRc3 are approximately parallel to the X direction, and the side surfaces MRc2 and MRc4 are approximately parallel to the Y direction. Also, each of the main surface MRa and the back surface MRb is a surface parallel to both of the X direction and the Y direction.

The planar shape of the sealing portion MR, that is, the planar shape of the main surface MRa and the back surface MRb of the sealing portion MR is, for example, a rectangular shape (oblong shape). Note that the rectangle constituting the planar shape of the sealing portion MR is a rectangle having the sides parallel to the X direction and the sides parallel to the Y direction, and the size of the sealing portion MR in the X direction is larger than that in the Y direction.

Each of the plurality of leads LD has a part sealed in the sealing portion MR and the other part projecting from the side surfaces of the sealing portion MR to outside. Hereinafter, the part of the lead LD located inside the sealing portion MR is referred to as an inner lead portion, and the part of the lead LD located outside the sealing portion MR is referred to as an outer lead portion. A plating layer (not shown) such as a solder plating layer may be formed on the outer lead portion of the lead LD. Consequently, it becomes easy to mount the semiconductor device PKG on the wiring board or the like (solder mounting).

Note that the semiconductor device PKG according to this embodiment has the structure in which a part of each lead LD (outer lead portion) projects from the side surface of the sealing portion MR and the structure will be described below. However, the structure of the semiconductor device PKG is not limited to this. For example, it is also possible to adopt the configuration in which each lead LD scarcely projects from the side surface of the sealing portion MR and a part of each lead LD is exposed on the back surface MRb of the sealing portion MR (SON (Small Outline Nonleaded Package) configuration).

The plurality of leads LD include the leads LD arranged on the side close to the side surface MRc1 of the sealing portion MR and the leads LD arranged on the side close to the side surface MRc3 of the sealing portion MR. In the case shown in FIGS. 2 to 10, the lead LD is not arranged on the side close to the side surface MRc2 of the sealing portion MR and the side close to the side surface MRc4 of the sealing portion MR. The plurality of leads LD arranged on the side close to the side surface MRc1 of the sealing portion MR extend in the Y direction and are arrayed at predetermined intervals in the X direction in plan view. Also, the plurality of leads LD arranged on the side close to the side surface MRc3 of the sealing portion MR extend in the Y direction and are arrayed at predetermined intervals in the X direction in plan view. The outer lead portion of each lead LD is bent such that the lower surface near the end portion of the outer lead portion is located on substantially the same plane as the back surface MRb of the sealing portion MR. The outer lead portions of the leads LD function as external connection terminals (external terminals) of the semiconductor device PKG. Note that the plurality of leads LD of the semiconductor device PKG include leads LD1, LD2, LD3, LD4, LD5a, LD5b, LD6, LD7, and LD8 described later.

The die pad DPC is a chip mounting portion for mounting the semiconductor chip CPC, the die pad DPH is a chip mounting portion for mounting the semiconductor chip CPH, and the die pad DPL is a chip mounting portion for mounting the semiconductor chip CPL. The planar shape of each of the die pads DPC, DPH, and DPL is, for example, a rectangular shape having the sides parallel to the X direction and the sides parallel to the Y direction. In the case of FIGS. 2 to 10, since the size of each of the semiconductor chips CPC, CPH, and CPL in the Y direction is larger than that in the X direction, the size of each of the die pads DPC, DPH, and DPL in the Y direction is larger than that in the X direction.

The die pad DPH, the die pad DPC, and the die pad DPL are arranged in this order in the X direction. Thus, the die pad DPC is arranged between the die pad DPH and the die pad DPL. The die pad DPH and the die pad DPC are adjacent to each other in the X direction but are not in contact with each other and are separated at a predetermined interval, and a part of the sealing portion MR is interposed therebetween. Also, the die pad DPC and the die pad DPL are adjacent to each other in the X direction but are not in contact with each other and are separated at a predetermined interval, and another part of the sealing portion MR is interposed therebetween.

The die pads DPC, DPH, and DPL and the plurality of leads LD are made of a conductive material (metal material), and are preferably made of copper (Cu) or copper alloy. Further, the die pads DPC, DPH, and DPL, the plurality of leads LD, and lead coupling portions LB1, LB2, LB3, and LB4 are preferably formed of the same material (same metal material), whereby a lead frame in which the die pads DPC, DPH, and DPL and the plurality of leads LD are coupled can be easily manufactured, and it becomes easy to manufacture the semiconductor device PKG using the lead frame.

The die pad DPC has a main surface DPCa on which the semiconductor chip CPC is mounted and a back surface DPCb on a side opposite to the main surface DPCa. Also, the die pad DPH has a main surface DPHa on which the semiconductor chip CPH is mounted and a back surface DPHb on a side opposite to the main surface DPHa. Further, the die pad DPL has a main surface DPLa on which the semiconductor chip CPL is mounted and a back surface DPLb on a side opposite to the main surface DPLa.

At least a part of each of the die pads DPC, DPH, and DPL is sealed by the sealing portion MR, and the back surface DPCb of the die pad DPC, the back surface DPHb of the die pad DPH, and the back surface DPLb of the die pad DPL are exposed from the main surface MRa of the sealing portion MR in this embodiment. Consequently, the heat generated during the operation of the semiconductor chips CPC, CPH, and CPL can be dissipated to the outside of the semiconductor device PKG mainly from the back surfaces of the semiconductor chips CPC, CPH, and CPL through the die pads DPC, DPH, and DPL.

In addition, in the die pads DPC, DPH, and DPL, the leads LD, and the lead coupling portions LB2 and LB4, a plating layer (not shown) made of silver (Ag) or the like may be formed in the regions where the semiconductor chips CPC, CPH, and CPL are mounted, the regions to which the wires BW are connected, and the regions to which the metal plates MP1 and MP2 are connected. Consequently, the semiconductor chips CPC, CPH, and CPL, the metal plates MP1 and MP2, and the wires BW can be connected more accurately to the die pads DPC, DPH, and DPL, the leads LD, and the lead coupling portions LB2 and LB4.

The semiconductor chip CPH is mounted on the main surface DPHa of the die pad DPH, with the back surface being directed to the die pad DPH. The semiconductor chip CPH is mounted on the main surface DPHa of the die pad DPH via a conductive bonding material (adhesive layer) BD1. A back surface electrode (electrode, drain electrode, back surface drain electrode) BEH is formed on the back surface (entire back surface) of the semiconductor chip CPH, and the back surface electrode BEH is bonded and electrically connected to the die pad DPH via the conductive bonding material BD1.

Also, the semiconductor chip CPL is mounted on the main surface DPLa of the die pad DPL, with the back surface being directed to the die pad DPL. The semiconductor chip CPL is mounted on the main surface DPLa of the die pad DPL via a conductive bonding material (adhesive layer) BD2. A back surface electrode (electrode, drain electrode, back surface drain electrode) BEL is formed on the back surface (entire back surface) of the semiconductor chip CPL, and the back surface electrode BEL is bonded and electrically connected to the die pad DPL via the conductive bonding material BD2.

In addition, the semiconductor chip CPC is mounted on the main surface DPCa of the die pad DPC, with the back surface being directed to the die pad DPC. The semiconductor chip CPC is mounted on the main surface DPCa of the die pad DPC via a bonding material (adhesive layer) BD3, but the bonding material BD3 may be conductive or insulative.

The planar shape of each of the semiconductor chips CPC, CPH, and CPL is, for example, a rectangular shape, more specifically, a rectangular shape having the sides parallel to the X direction and the sides parallel to the Y direction. The planar size (planar area) of the die pad DPH is larger than that of the semiconductor chip CPH, the planar size of the die pad DPL is larger than that of the semiconductor chip CPL, and the planar size of the die pad DPC is larger than that of the semiconductor chip CPC. Therefore, in plan view, the semiconductor chip CPH is included in the main surface DPHa of the die pad DPH, the semiconductor chip CPL is included in the main surface DPLa of the die pad DPL, and the semiconductor chip CPC is included in the main surface DPCa of the die pad DPC. The semiconductor chips CPC, CPH, and CPL are sealed in the sealing portion MR and are not exposed from the sealing portion MR.

The back surface electrode BEH of the semiconductor chip CPH functions as both of the drain electrode of the power MOSFET 1 and the drain electrode of the sense MOSFET 3. Therefore, the back surface electrode BEH of the semiconductor chip CPH is electrically connected to the drain (D1) of the power MOSFET 1 and the drain (D3) of the sense MOSFET 3 formed in the semiconductor chip CPH. Also, the back surface electrode BEL of the semiconductor chip CPL functions as both of the drain electrode of the power MOSFET 2 and the drain electrode of the sense MOSFET 4. Therefore, the back surface electrode BEL of the semiconductor chip CPL is electrically connected to the drain (D2) of the power MOSFET 2 and the drain (D4) of the sense MOSFET 4 formed in the semiconductor chip CPL.

The bonding materials BD1 and BD2 are preferably made of a paste conductive bonding material such as silver paste (silver paste bonding material). In the semiconductor device PKG, the paste conductive bonding material constituting each of the bonding materials BD1 and BD2 is already in a cured state.

On a front surface (main surface on a side opposite to the side where the back surface electrode BEH is formed) of the semiconductor chip CPH, a bonding pad PDHG for gate, bonding pads PDHS1 and PDHS2 for source, a bonding pad PDHA for anode of temperature detecting diode, and a bonding pad PDHC for cathode of temperature detecting diode are arranged. Also, on a front surface (main surface on a side opposite to the side where the back surface electrode BEL is formed) of the semiconductor chip CPL, a bonding pad PDLG for gate, bonding pads PDLS1 and PDLS2 for source, a bonding pad PDLA for anode of temperature detecting diode, and a bonding pad PDLC for cathode of temperature detecting diode are arranged. In addition, on a front surface (main surface on an opposite side of back surface side) of the semiconductor chip CPC, a plurality of bonding pads PDC are arranged. Hereinafter, "bonding pad", "bonding pad electrode", "pad electrode", or "electrode" is referred to simply as "pad".

The pad PDC of the semiconductor chip CPC is electrically connected to the control circuit CLC formed in the semiconductor chip CPC through an internal wiring of the semiconductor chip CPC.

The pad PDHG for gate of the semiconductor chip CPH is electrically connected to the gate electrode of the power MOSFET 1 and the gate electrode of the sense MOSFET 3 formed in the semiconductor chip CPH. Also, the pad PDHS1 for source of the semiconductor chip CPH is electrically connected to the source (S1) of the power MOSFET 1 formed in the semiconductor chip CPH, and the pad PDHS2 for source of the semiconductor chip CPH is electrically connected to the source (S3) of the sense MOSFET 3 formed in the semiconductor chip CPH. In the semiconductor chip CPH, the planar size (area) of the pad PDHS1 for source is larger than that of each of the other pads PDHG, PDHS2, PDHA, and PDHC.

Further, the pad PDLG for gate of the semiconductor chip CPL is electrically connected to the gate electrode of the power MOSFET 2 and the gate electrode of the sense MOSFET 4 formed in the semiconductor chip CPL. Also, the pad PDLS1 for source of the semiconductor chip CPL is electrically connected to the source (S2) of the power MOSFET 2 formed in the semiconductor chip CPL, and the pad PDLS2 for source of the semiconductor chip CPL is electrically connected to the source (S4) of the sense MOSFET 4 formed in the semiconductor chip CPL. In the semiconductor chip CPL, the planar size (area) of the pad PDLS1 for source is larger than that of each of the other pads PDLG, PDLS2, PDLA, and PDLC.

Note that a plurality of unit transistor cells constituting the power MOSFET 1 are formed on the semiconductor substrate constituting the semiconductor chip CPH, and the power MOSFET 1 is formed by connecting the plurality of unit transistor cells in parallel. Also, a plurality of unit transistor cells constituting the power MOSFET 2 are formed on the semiconductor substrate constituting the semiconductor chip CPL, and the power MOSFET 2 is formed by connecting the plurality of unit transistor cells in parallel. Each unit transistor cell is made of, for example, a trench-gate MISFET. In each of the semiconductor chips CPH and CPL, the source-drain current of the power MOSFET (1, 2) flows in the thickness direction of the semiconductor substrate constituting the semiconductor chip.

Not only the power MOSFET 1 and the sense MOSFET 3 but also the temperature detecting diode is formed in the semiconductor chip CPH, and the pad PDHA is electrically connected to the anode of the temperature detecting diode and the pad PDHC is electrically connected to the cathode of the temperature detecting diode. Further, not only the power MOSFET 2 and the sense MOSFET 4 but also the temperature detecting diode is formed in the semiconductor chip CPL, and the pad PDLA is electrically connected to the anode of the temperature detecting diode and the pad PDLC is electrically connected to the cathode of the temperature detecting diode. Note that the illustration of the temperature detecting diode is omitted in the circuit diagram of FIG. 1.

On the front surface of the semiconductor chip CPH, the pads (pads PDHG, PDHS2, PDHA, and PDHC in this case) other than the pad PDHS1 for source are arranged along the side facing the semiconductor chip CPC. Then, the pads PDHG, PDHS2, PDHA, and PDHC other than the pad PDHS1 for source of the semiconductor chip CPH are electrically connected to the pads PDC of the semiconductor chip CPC through the wires BW, respectively. Namely, one ends of the wires BW are connected to the pads PDHG, PDHS2, PDHA, and PDHC and the other ends of the wires BW are connected to the pads PDC of the semiconductor chip CPC.

Also, on the front surface of the semiconductor chip CPL, the pads (pads PDLG, PDLS2, PDLA, and PDLC in this case) other than the pad PDLS1 for source are arranged along the side facing the semiconductor chip CPC. Then, the pads PDLG, PDLS2, PDLA, and PDLC other than the pad PDLS1 for source of the semiconductor chip CPL are electrically connected to the pads PDC of the semiconductor chip CPC through the wires BW, respectively. Namely, one ends of the wires BW are connected to the pads PDLG, PDLS2, PDLA, and PDLC and the other ends of the wires BW are connected to the pads PDC of the semiconductor chip CPC.

The wire (bonding wire) BW is a conductive connecting member and is more specifically a conductive wire. Since the wire BW is made of metal, it can be regarded also as a metal wire (metal thin wire). A gold (Au) wire, a copper (Cu) wire, an aluminum (Al) wire, or the like can be suitably used as the wire BW. The wire BW is sealed in the sealing portion MR and is not exposed from the sealing portion MR. The part of each lead LD to which the wire SW is connected is the inner lead portion located inside the sealing portion MR.

The pad PDHS1 for source of the semiconductor chip CPH is electrically connected to the lead coupling portion (lead wiring portion, metal portion) LB2 through the metal plate MP1. Namely, the metal plate MP1 is bonded to the pad PDHS1 for source of the semiconductor chip CPH via a conductive bonding material (adhesive layer) BD4 and is bonded to the lead coupling portion LB2 via a conductive bonding material (adhesive layer) BD5. The lead coupling portion LB2 can be regarded also as a metal portion for bonding the metal plate MP1 via the bonding material BD5.

The pad PDLS1 for source of the semiconductor chip CPL is electrically connected to the lead coupling portion (lead wiring portion, metal portion) LB4 through the metal plate MP2. Namely, the metal plate MP2 is bonded to the pad PDLS1 for source of the semiconductor chip CPL via a conductive bonding material (adhesive layer) BD6 and is bonded to the lead coupling portion LB4 via a conductive bonding material (adhesive layer) BD7. The lead coupling portion LB4 can be regarded also as a metal portion for bonding the metal plate MP2 via the bonding material BD7.

Since the metal plate MP1 is used instead of a wire for electrically connecting the pad PDHS1 for source of the semiconductor chip CPH and the lead LD2, the on resistance of the power MOSFET 1 can be reduced. Also, since the metal plate MP2 is used instead of a wire for electrically connecting the pad PDLS1 for source of the semiconductor chip CPL and the lead LD4, the on resistance of the power MOSFET 2 can be reduced. Consequently, the package resistance can be reduced and the conduction loss can be reduced.

The bonding materials BD4, BD5, BD6, and BD7 are preferably made of a paste conductive bonding material such as a silver paste (silver paste bonding material). In the semiconductor device PKG, the paste conductive bonding material constituting each of the bonding materials BD4, BD5, BD6, and BD7 is already in a cured state.

The metal plates MP1 and MP2 are conductor plates made of a conductive material and are preferably formed of the same material (same metal material) as those of the die pads DPH, DPL, and DPC, the leads LD, and the lead coupling portions LB1, LB2, LB3, and LB4. Therefore, the metal plates MP1 and MP2 are preferably made of copper (Cu) or copper (Cu) alloy. The size (width) of each of the metal plates MP1 and MP2 in the X direction and the Y direction is larger than the diameter of the wire BW.

The heat generated in the semiconductor chips CPH and CPL is dissipated from the front surfaces of the semiconductor chips CPH and CPL through the metal plates MP1 and MP2 as well as the back surfaces of the semiconductor chips CPH and CPL through the die pads DPH and DPL, and it is thus possible to improve the heat dissipation from the semiconductor chips CPH and CPL.

Of the plurality of pads PDC of the semiconductor chip CPC, the pads PDC that are not connected to the pads of the semiconductor chip CPH and the pads of the semiconductor chip CPL are electrically connected to the leads LD5a and LD5b of the plurality of leads LD of the semiconductor device PKG. Namely, one ends of the wires BW are connected to the pads PDC of the semiconductor chip CPC that are not connected to the pads of the semiconductor chip CPH and the pads of the semiconductor chip CPL, and the other ends of the wires BW are connected to the inner lead portions of the leads LD5a or the inner lead portions of the leads LD5b. Each of the leads LD5a and LD5b can function as a signal transmission path between the semiconductor chip CPC in the semiconductor device PKG and the control circuit CT outside the semiconductor device PKG.

Of the plurality of leads LD5a and LD5b, the leads LD5a are arranged on the side close to the side surface MRc1 of the sealing portion MR, and the leads LD5b are arranged on the side close to the side surface MRc3 of the sealing portion MR. Each of the leads LD5a and LD5b is not connected to any of the die pads DPC, DPH, and DPL, the leads LD1, LD2, LD3, and LD4, and the lead coupling portions LB1, LB2, LB3, and LB4 via conductors, and are isolated leads.

The lead coupling portion LB2 is adjacent to the die pad DPG in the Y direction and extends along the side surface MRc3 in the X direction in the sealing portion MR, but is separated from the die pad DPH. Also, the lead coupling portion LB4 is adjacent to the die pad DPL in the Y direction and extends along the side surface MRc1 in the X direction in the sealing portion MR, but is separated from the die pad DPL. The lead coupling portions LB2 and LB4 are sealed in the sealing portion MR and are not exposed from the sealing portion MR.

The leads LD2 of the plurality of leads LD of the semiconductor device PKG are collectively connected (coupled) to the lead coupling portion LB2. Namely, the lead coupling portion LB2 and the leads LD2 are integrally formed. The plurality of leads LD2 are adjacent to each other in the X direction, and the inner lead portions of the plurality of leads LD2 are coupled by the lead coupling portion LB2 extending in the X direction in the sealing portion MR. The plurality of leads LD2 and the lead coupling portion LB2 are electrically connected to the pad PDHS1 of the semiconductor chip CPH through the metal plate MP1 and the like and thus electrically connected to the source (S1) of the power MOSFET 1 formed in the semiconductor chip CPH, and correspond to the terminal TE2 described above.

Also, the leads LD4 of the plurality of leads LD of the semiconductor device PKG are collectively connected (coupled) to the lead coupling portion LB4. Namely, the lead coupling portion LB4 and the leads LD4 are integrally formed. The plurality of leads LD4 are adjacent to each other in the X direction, and the inner lead portions of the plurality of leads LD4 are coupled by the lead coupling portion LB4 extending in the X direction in the sealing portion MR. The plurality of leads LD4 and the lead coupling portion LB4 are electrically connected to the pad PDLS1 of the semiconductor chip CPL through the metal plate MP2 and the like and thus electrically connected to the source (S2) of the power MOSFET 2 formed in the semiconductor chip CPL, and correspond to the terminal TE4 described above.

Since the plurality of leads LD2 are collectively connected to the lead coupling portion LB2, the volume can be increased as compared with the case where the plurality of leads LD2 are divided, so that the wiring resistance can be reduced and the conduction loss of the power MOSFET 1 can be reduced. The same applies to the plurality of leads LD4 and the lead coupling portion LB4.

Of the plurality of leads LD of the semiconductor device PKG, the leads LD1 are integrally formed with the die pad DPH. Therefore, the plurality of leads LD1 are electrically connected to the back surface electrode BEH of the semiconductor chip CPH through the die pad DPH and the conductive bonding material BD1, and correspond to the terminal TE1 described above.

Also, of the plurality of leads LD of the semiconductor device PKG, the leads LD3 are integrally formed with the die pad DPL. Therefore, the plurality of leads LD3 are electrically connected to the back surface electrode BEL of the semiconductor chip CPL through the die pad DPL and the conductive bonding material BD2, and correspond to the terminal TE3 described above.

When the semiconductor device PKG only is seen, the plurality of leads LD2 and the plurality of leads LD4 of the semiconductor device PKG are not electrically connected. However, in the case where the inverter circuit INV is formed using the semiconductor device PKG, the plurality of leads LD2 and the plurality of leads LD4 of the semiconductor device PKG are electrically connected through the wiring or the like of the wiring board by mounting the semiconductor device PKG on the wiring board or the like.

The plurality of leads LD1 are arranged on the side close to the side surface MRc1 of the sealing portion MR so as to be adjacent to the die pad DPH in the Y direction, and the plurality of leads LD3 are arranged on the side close to the side surface MRc3 of the sealing portion MR so as to be adjacent to the die pad DPL in the Y direction.

The plurality of leads LD1 are adjacent to each other in the X direction, and the inner lead portions of the plurality of leads LD1 are coupled by the lead coupling portion LB1 extending in the X direction in the sealing portion MR. The lead coupling portion LB1 is integrally connected to the die pad DPH via a coupling portion LB1a extending in the Y direction.

Also, the plurality of leads LD3 are adjacent to each other in the X direction, and the inner lead portions of the plurality of leads LD3 are coupled by the lead coupling portion LB3 extending in the X direction in the sealing portion MR. The lead coupling portion LB3 is integrally connected to the die pad DPL via a coupling portion LB3a extending in the Y direction.

Also, the plurality of leads LD8 are integrally coupled to the die pad DPC. These leads LD8 are used to support the die pad DPC to a frame body of the lead frame when manufacturing the semiconductor device PKG. In addition, the lead LD6 is integrally coupled to the die pad DPH. This lead LD6 is used to support the die pad DPH to the frame body of the lead frame when manufacturing the semiconductor device PKG. Further, the lead LD7 is integrally coupled to the die pad DPL. This lead LD7 is used to support the die pad DPL to the frame body of the lead frame when manufacturing the semiconductor device PKG.

Also, suspension leads TL integrally coupled to the die pad DPH are arranged on the side close to the side surface MRc2 of the sealing portion MR, and suspension leads TL integrally coupled to the die pad DPL are arranged on the side close to the side surface MRc4 of the sealing portion MR. These suspension leads TL are used to support the die pads DPH and DPL to the frame body of the lead frame when manufacturing the semiconductor device PKG. The suspension leads TL are not exposed from the side surfaces of the sealing portion MR.

In the semiconductor device PKG, when the power MOSFET 1 is in the ON state, current flows from the lead LD1 for drain of the power MOSFET 1 to the lead LD2 for source of the power MOSFET 1 through the semiconductor chip CPH (power MOSFET 1). Also, in the semiconductor device PKG, when the power MOSFET 2 is in the ON state, current flows from the lead LD3 for drain of the power MOSFET 2 to the lead LD4 for source of the power MOSFET 2 through the semiconductor chip CPL (power MOSFET 2).

<Manufacturing Process of Semiconductor Device>

Next, a manufacturing process (assembly process) of the semiconductor device PKG shown in FIGS. 2 to 10 above will be described. FIGS. 11 to 26 are plan views and cross-sectional views in the manufacturing process of the semiconductor device PKG according to this embodiment. Of FIGS. 11 to 26, FIGS. 11, 12, 16, and 20 are plan views and FIGS. 13 to 15, 17 to 19, and 21 to 26 are cross-sectional views. Note that FIGS. 13, 17, 21, 23, and 25 correspond to the cross-sectional views at the cross-sectional position corresponding to FIG. 7, FIGS. 14 and 18 correspond to the cross-sectional views at the cross-sectional position corresponding to FIG. 8, and FIGS. 15, 19, 22, 24, and 26 correspond to the cross-sectional views at the cross-sectional position corresponding to FIG. 9.

For manufacturing the semiconductor device PKG, first, a lead frame LF is prepared and the semiconductor chips CPC, CPH, and CPL are prepared. The order of preparing the lead frame LF and the semiconductor chips CPC, CPH, and CPL is not particularly limited, and they may be prepared simultaneously.

Figure 11:
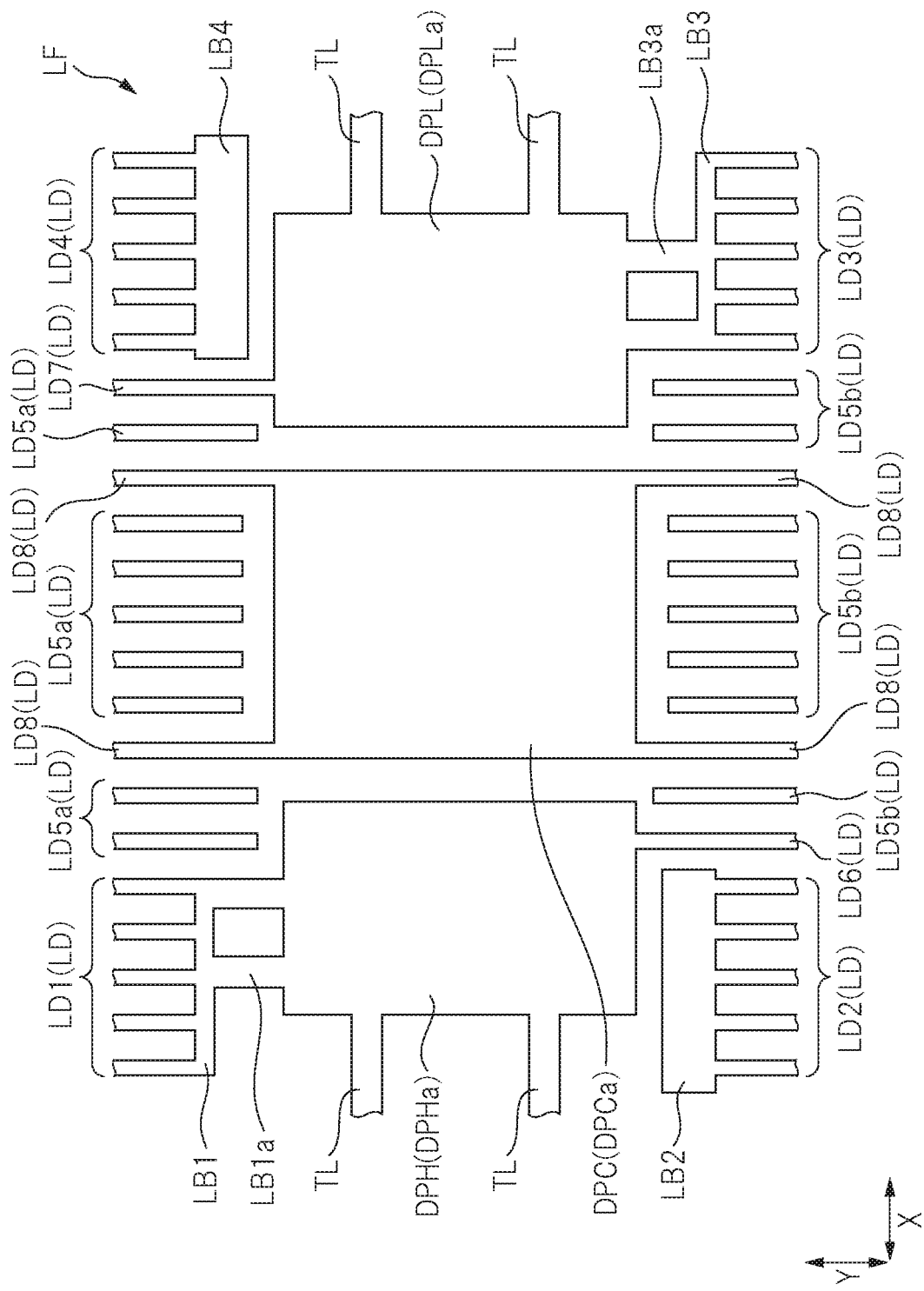
FIG. 11 is a plan view of the semiconductor device in a manufacturing process according to the embodiment.
Figure 12:
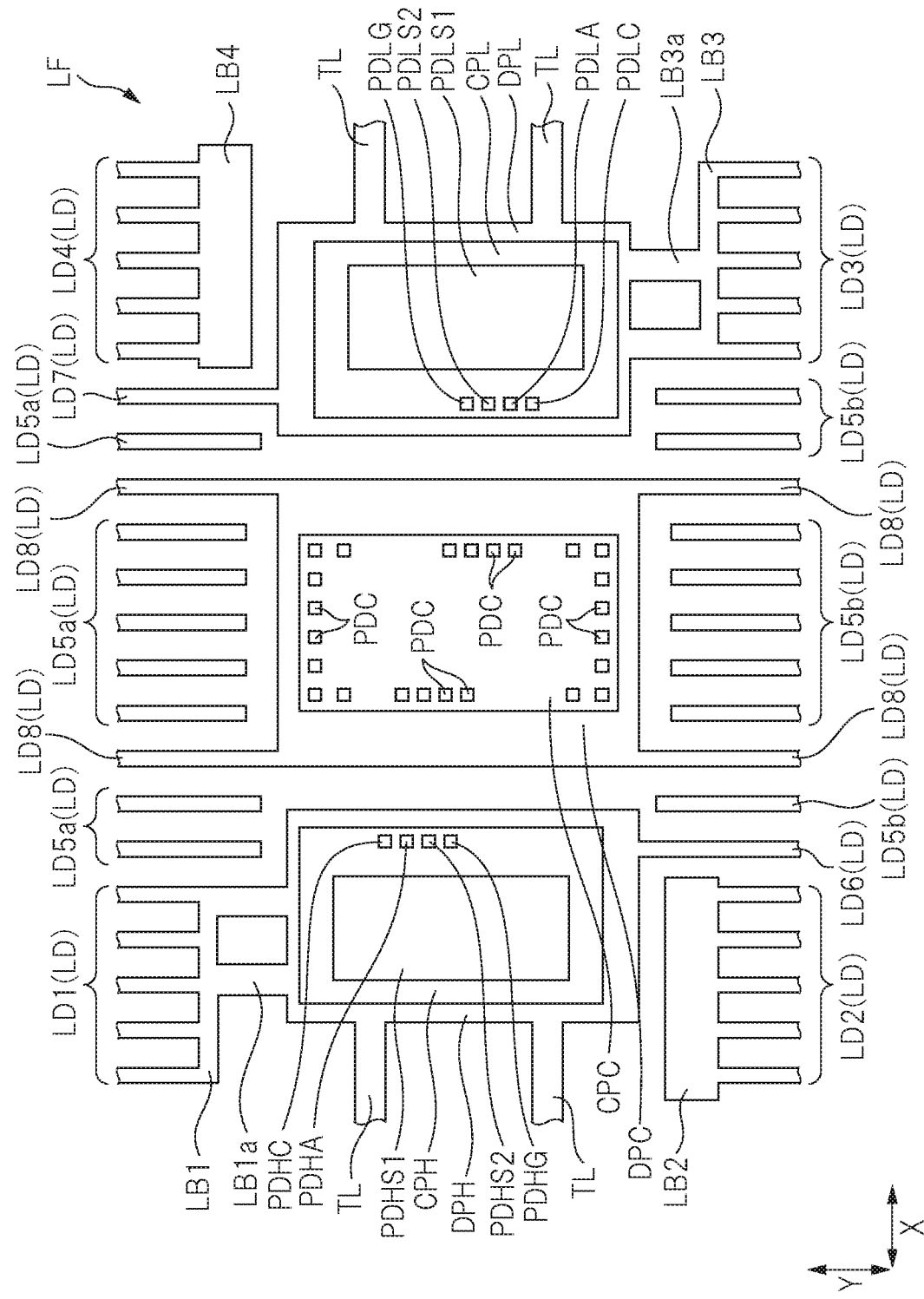
FIG. 12 is a plan view of the semiconductor device in the manufacturing process continued from FIG. 11.
Figure 13:
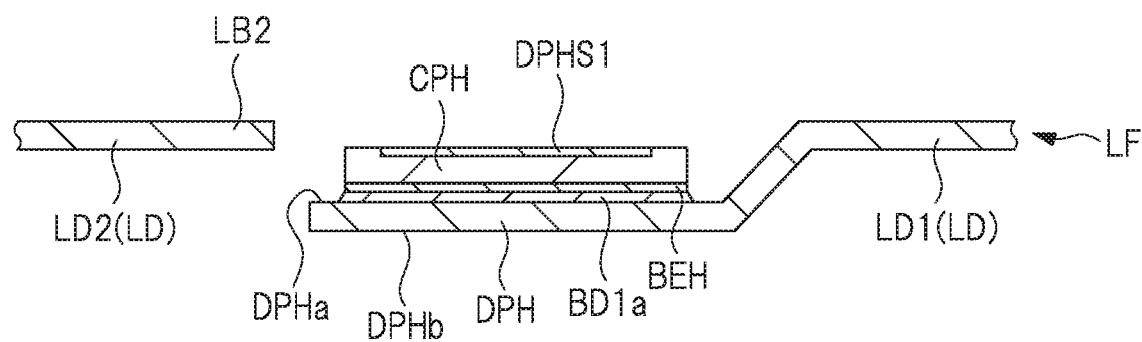
FIG. 13 is a cross-sectional view of the semiconductor device in the same manufacturing process as FIG. 12.
Figure 14:
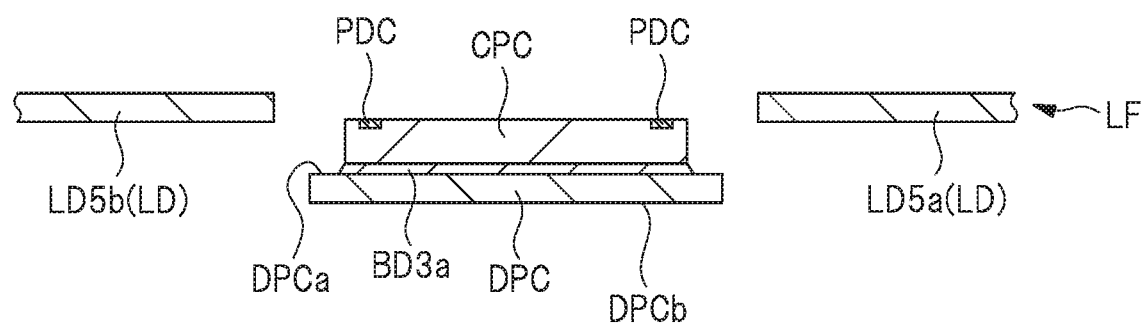
FIG. 14 is a cross-sectional view of the semiconductor device in the same manufacturing process as FIG. 12.
Figure 15:
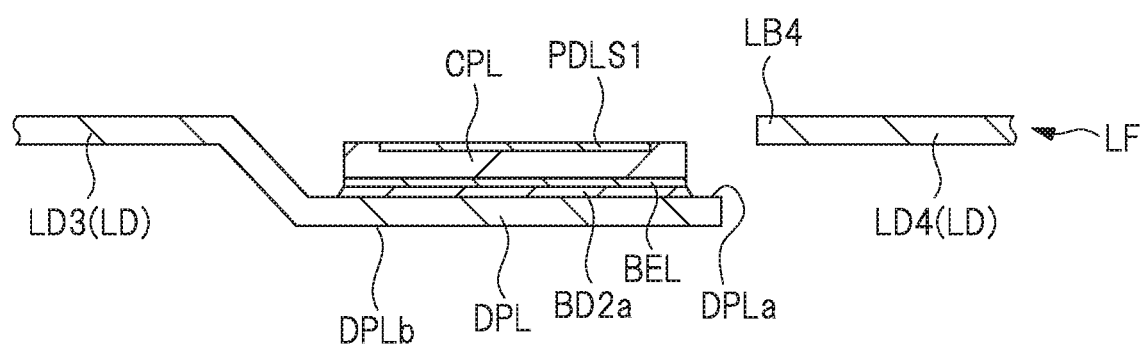
FIG. 15 is a cross-sectional view of the semiconductor device in the same manufacturing process as FIG. 12.
Figure 16:
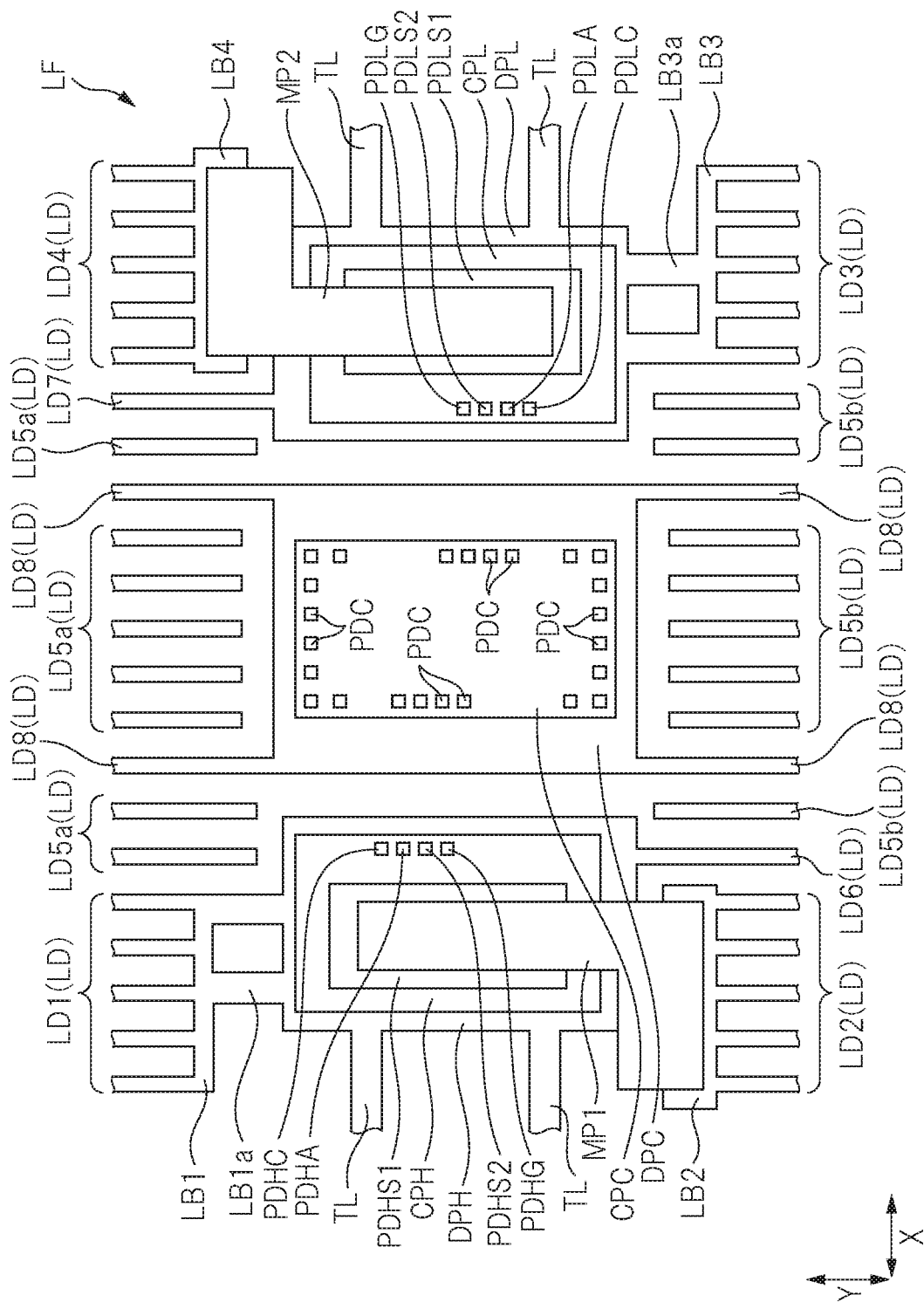
FIG. 16 is a plan view of the semiconductor device in the manufacturing process continued from FIG. 12.
Figure 17:
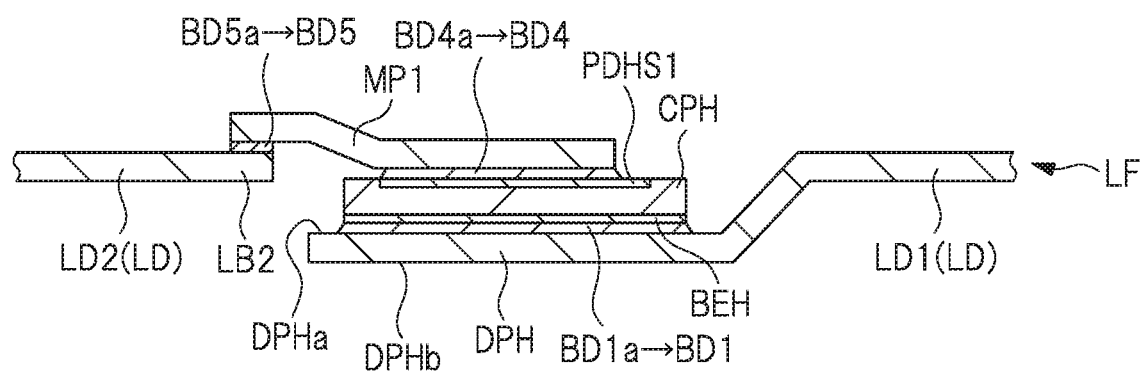
FIG. 17 is a cross-sectional view of the semiconductor device in the same manufacturing process as FIG. 16.
Figure 18:
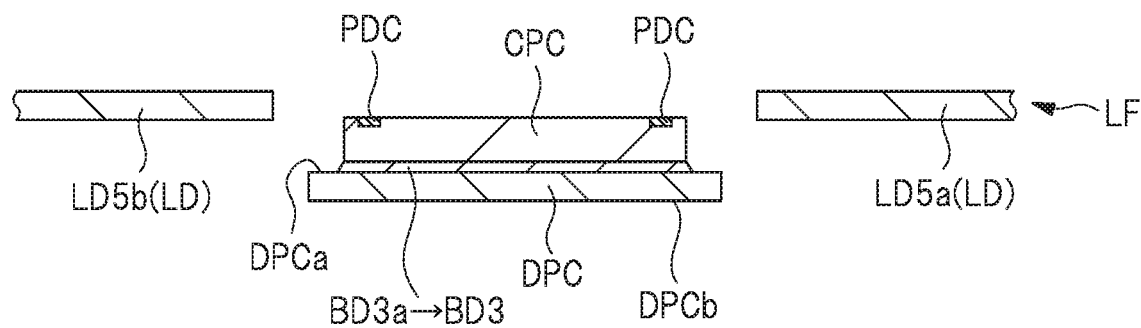
FIG. 18 is a cross-sectional view of the semiconductor device in the same manufacturing process as FIG. 16.
Figure 19:
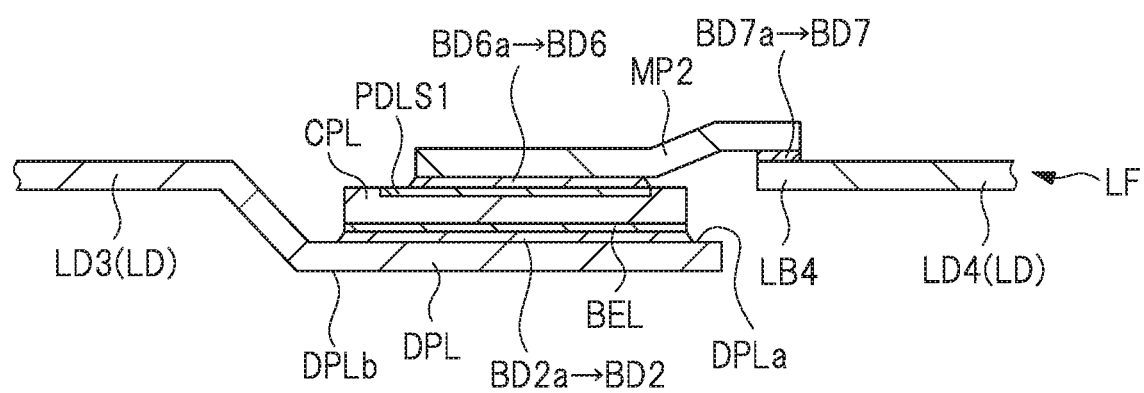
FIG. 19 is a cross-sectional view of the semiconductor device in the same manufacturing process as FIG. 16.

As shown in FIG. 11, the lead frame LF integrally includes the frame body (not shown), the die pads DPC, DPH, and DPL, the plurality of leads LD, the lead coupling portions LB1, LB2, LB3, and LB4, and the suspension leads TL. One ends of the respective leads LD are coupled to the frame body. The die pad DPC is coupled to the frame body by the leads LD8, the die pad DPH is coupled to the frame body by the leads LD1 and LD6 and the suspension leads TL, and the die pad DPL is coupled to the frame body by the leads LD3 and LD7 and the suspension leads TL. The lead frame LF is preferably made of a metal material mainly made of copper (Cu) and is specifically made of copper (Cu) or copper (Cu) alloy. FIG. 11 shows the region of the lead frame LF from which one semiconductor device PKG is manufactured.

Note that the following process is performed in the state where the main surfaces DPCa, DPHa, and DPLa of the die pads DPC, DPH, and DPL of the lead frame LF are directed upward until the sealing portion MR is formed by the molding process.

Next, as shown in FIGS. 12 to 15, the die bonding process of the semiconductor chips CPH, CPL, and CPC is performed. Namely, the semiconductor chip CPH is mounted (arranged) on the main surface DPHa of the die pad DPH of the lead frame LF via the bonding material BD1a, the semiconductor chip CPL is mounted (arranged) on the main surface DPLa of the die pad DPL of the lead frame LF via the bonding material BD2a, and the semiconductor chip CPC is mounted (arranged) on the main surface DPCa of the die pad DPC of the lead frame LF via the bonding material BD3a. For example, after the bonding material BD1a is applied (supplied) onto the main surface DPHa of the die pad DPH, the bonding material BD2a is applied (supplied) onto the main surface DPLa of the die pad DPL, and the bonding material BD3a is applied (supplied) onto the main surface DPCa of the die pad DPC, the semiconductor chips CPH, CPL, and CPC may be mounted on the main surfaces DPHa, DPLa, and DPCa of the die pads DPH, DPL, and DPC, respectively. At this time, the semiconductor chips CPH, CPL, and CPC are mounted such that the back surfaces of the semiconductor chips CPH, CPL, and CPC are directed to the main surfaces DPHa, DPLa, and DPCa of the die pads DPH, DPL, and DPC. Each of the bonding materials BD1a, BD2a, and BD3a is the paste bonding material (adhesive material) and is preferably silver paste, but is not cured yet.

Next, the process of arranging the metal plates MP1 and MP2 is performed. Specifically, first, the bonding material BD5a is applied (supplied) onto the lead coupling portion LB2, the bonding material BD7a is applied (supplied) onto the lead coupling portion LB4, the bonding material BD4a is applied (supplied) onto the pad PDHS1 for source of the semiconductor chip CPH, and the bonding material BD6a is applied (supplied) onto the pad PDLS1 for source of the semiconductor chip CPL. Then, as shown in FIGS. 16 to 19, the metal plate MP1 is arranged (mounted) on the semiconductor chip CPH and the lead coupling portion LB2, and the metal plate MP2 is arranged on the semiconductor chip CPL and the lead coupling portion LB4. At this time, the metal plate MP1 is arranged such that a part of the metal plate MP1 is arranged on the pad PDHS1 for source of the semiconductor chip CPH via the bonding material BD4a and another part of the metal plate MP1 is arranged on the lead coupling portion LB2 via the bonding material BD5a. Also, the metal plate MP2 is arranged such that a part of the metal plate MP2 is arranged on the pad PDLS1 for source of the semiconductor chip CPL via the bonding material BD6a and another part of the metal plate MP2 is arranged on the lead coupling portion LB4 via the bonding material BD7a. Each of the bonding materials BD4a, BD5a, BD6a, and BD7a is the paste bonding material (adhesive material) and is preferably silver paste, but is not cured yet.

Next, the process of curing the bonding materials BD1a, BD2a, BD3a, BD4a, BD5a, BD6a, and BD7a (heat treatment) is performed. Consequently, the bonding material (adhesive layer) BD1 made of the cured bonding material BD1a, the bonding material (adhesive layer) BD2 made of the cured bonding material BD2a, and the bonding material (adhesive layer) BD3 made of the cured bonding material BD3a are formed. Further, the bonding material (adhesive layer) BD4 made of the cured bonding material BD4a, the bonding material (adhesive layer) BD5 made of the cured bonding material BD5a, the bonding material (adhesive layer) BD6 made of the cured bonding material BD6a, and the bonding material (adhesive layer) BD7 made of the cured bonding material BD7a are also formed. The semiconductor chip CPH is bonded and fixed to the die pad DPH by the bonding material BD1, the semiconductor chip CPL is bonded and fixed to the die pad DPL by the bonding material BD2, and the semiconductor chip CPC is bonded and fixed to the die pad DPC by the bonding material BD3. The metal plate MP1 is bonded and fixed to the pad PDHS1 for source of the semiconductor chip CPH by the bonding material BD4 and is bonded and fixed to the lead coupling portion LB2 by the bonding material BD5. The metal plate MP2 is bonded and fixed to the pad PDLS1 for source of the semiconductor chip CPL by the bonding material BD6 and is bonded and fixed to the lead coupling portion LB4 by the bonding material BD7.

Figure 20:
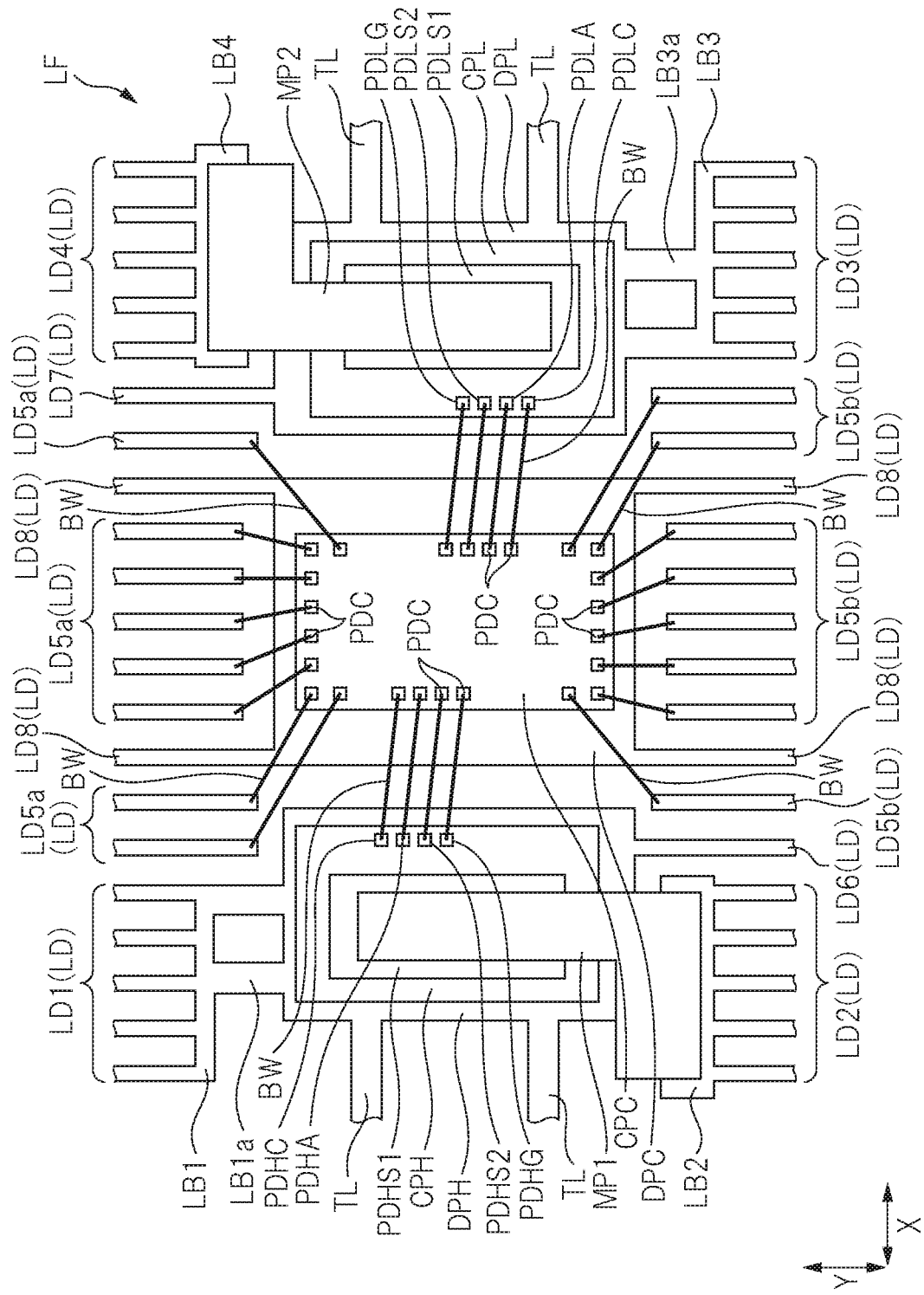
FIG. 20 is a plan view of the semiconductor device in the manufacturing process continued from FIG. 16.

Next, as shown in FIG. 20, the wire bonding process is performed. Specifically, the plurality of pads (PDHG, PDHS2, PDHA, PDHC) of the semiconductor chip CPH and the plurality of pads (PDC) of the semiconductor chip CPC are electrically connected through the wires BW, the plurality of pads (PDLG, PDLS2, PDLA, PDLC) of the semiconductor chip CPL and the plurality of pads (PDC) of the semiconductor chip CPC are electrically connected through the wires BW, and the plurality of pads (PDC) of the semiconductor chip CPC and the plurality of leads (LD5a, LD5b) of the lead frame LF are electrically connected through the wires BW.

It is also possible to use multiple types of wires made of different materials as the wires BW. For example, the plurality of pads (PDC) of the semiconductor chip CPC and the plurality of leads (LD5a, LD5b) of the lead frame LF are electrically connected through the wires SW made of copper (Cu). Then, the plurality of pads (PDHG, PDHS2, PDHA, PDHC) of the semiconductor chip CPH and the plurality of pads (PDC) of the semiconductor chip CPC are electrically connected through the wires BW made of gold (Au), and the plurality of pads (PDLG, PDLS2, PDLA, PDLC) of the semiconductor chip CPL and the plurality of pads (PDC) of the semiconductor chip CPC are electrically connected through the wires BW made of gold (Au).

Figure 21:
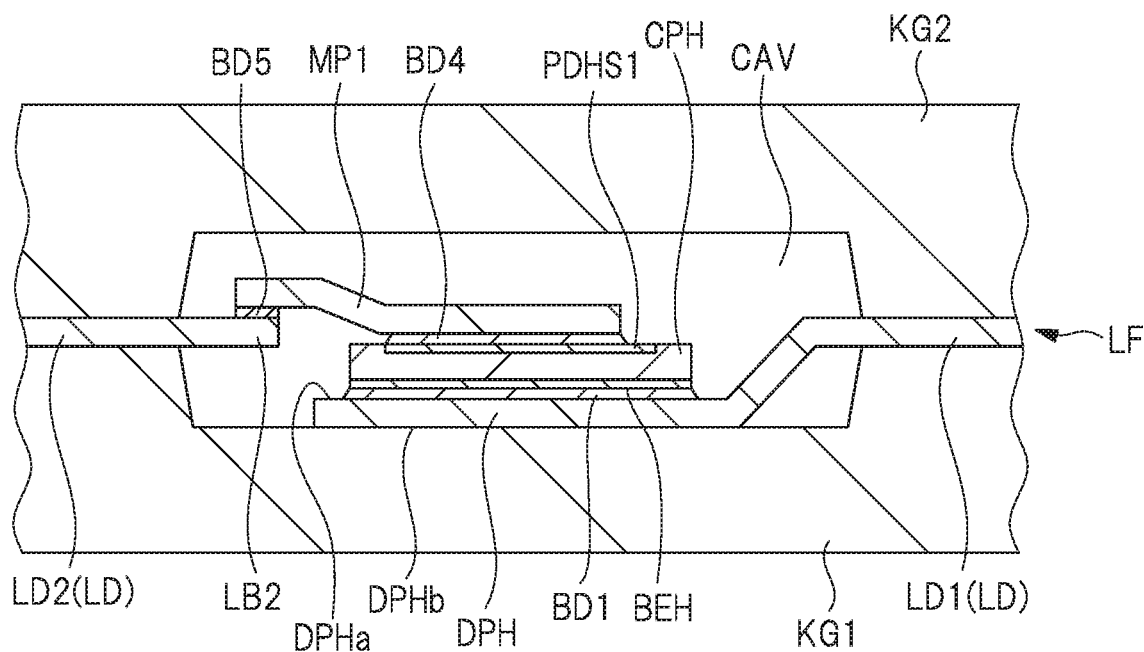
FIG. 21 is a cross-sectional view of the semiconductor device in the manufacturing process continued from FIG. 20.
Figure 22:
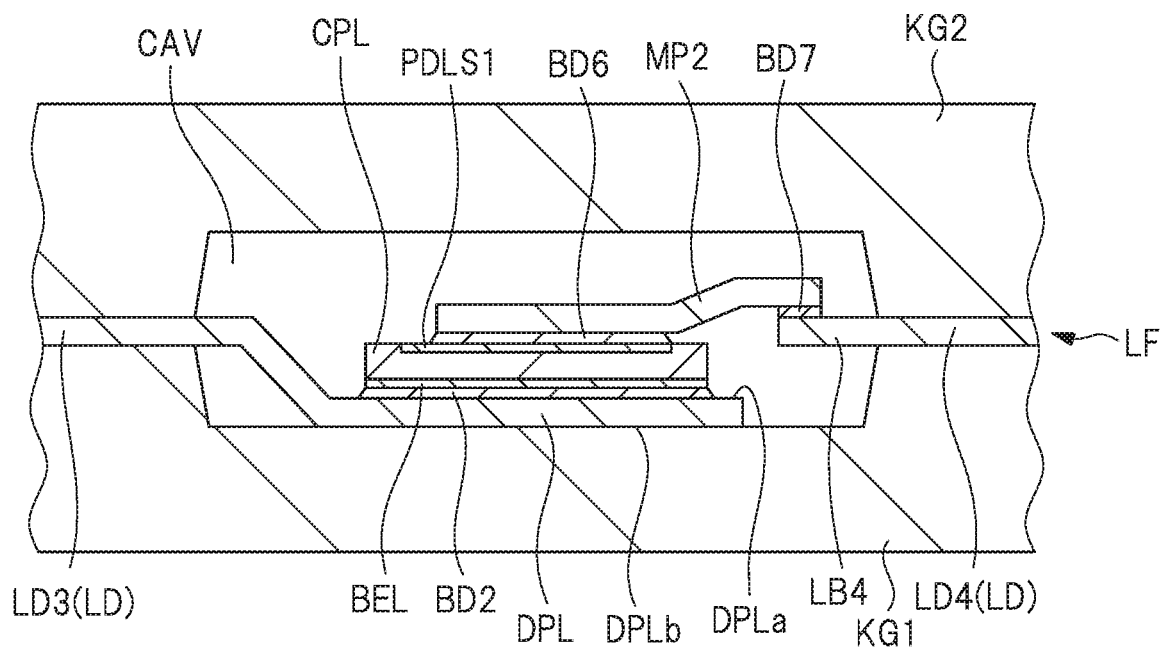
FIG. 22 is a cross-sectional view of the semiconductor device in the same manufacturing process as FIG. 21.
Figure 23:
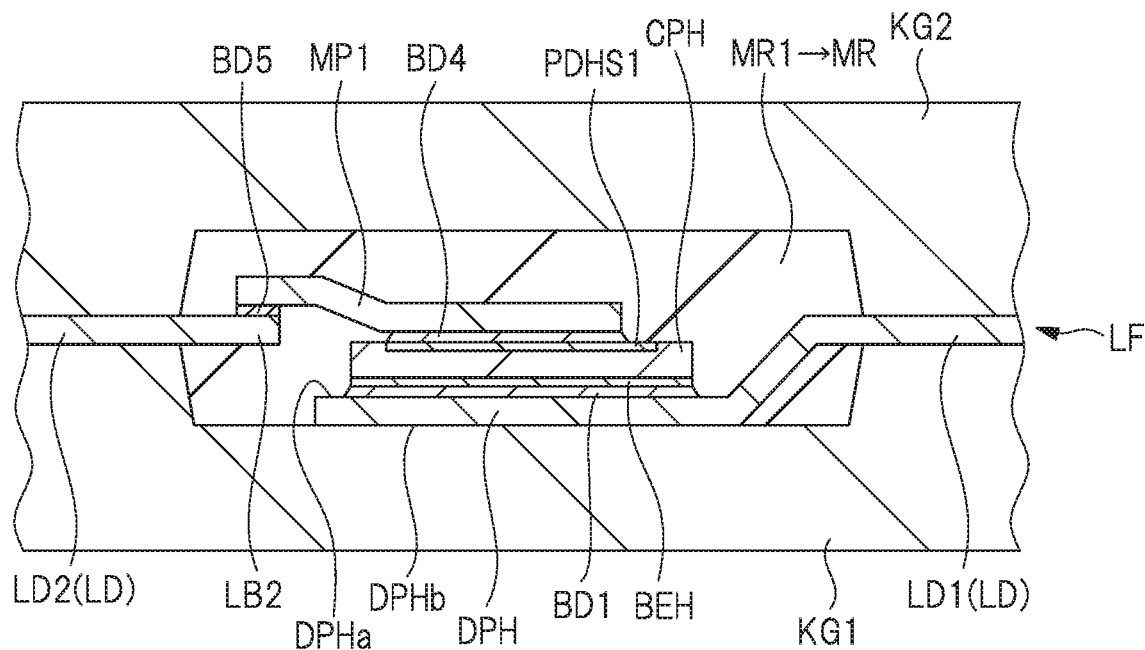
FIG. 23 is a cross-sectional view of the semiconductor device in the manufacturing process continued from FIG. 21.
Figure 24:
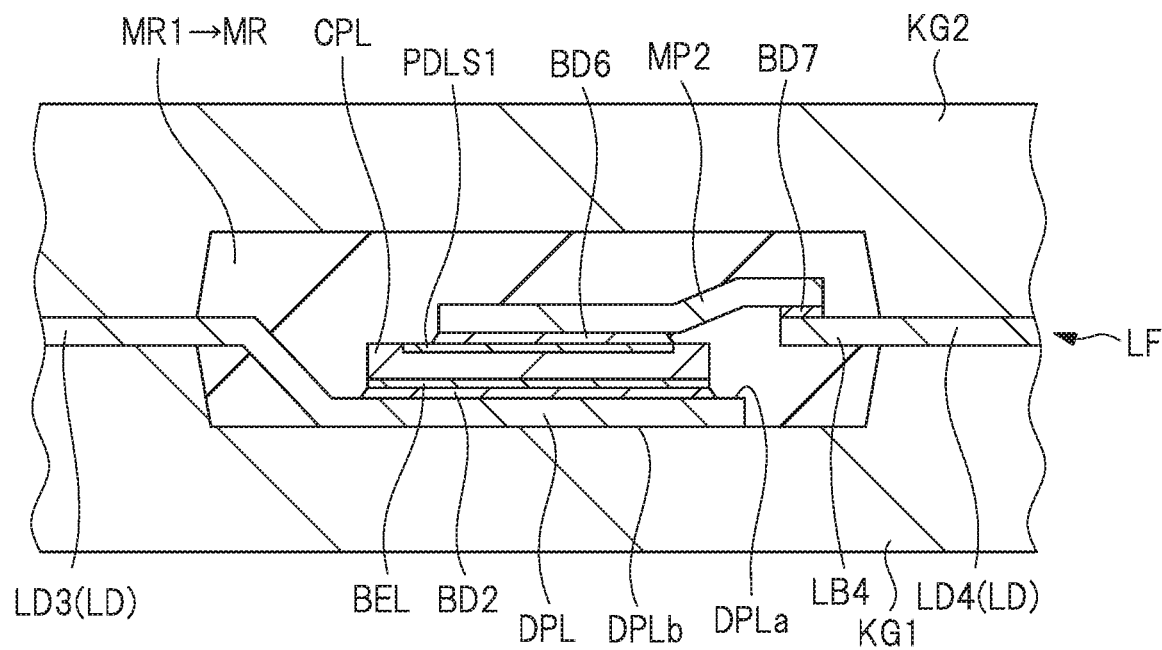
FIG. 24 is a cross-sectional view of the semiconductor device in the same manufacturing process as FIG. 23.
Figure 25:
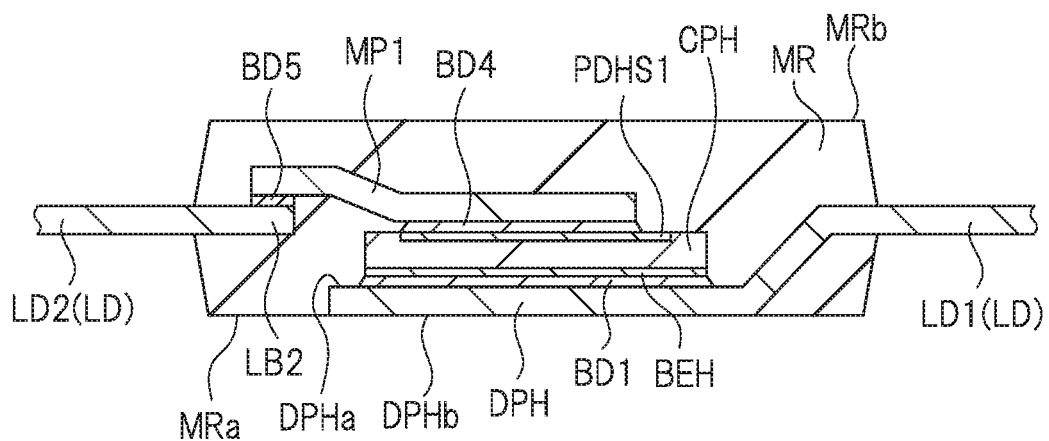
FIG. 25 is a cross-sectional view of the semiconductor device in the manufacturing process continued from FIG. 23.
Figure 26:
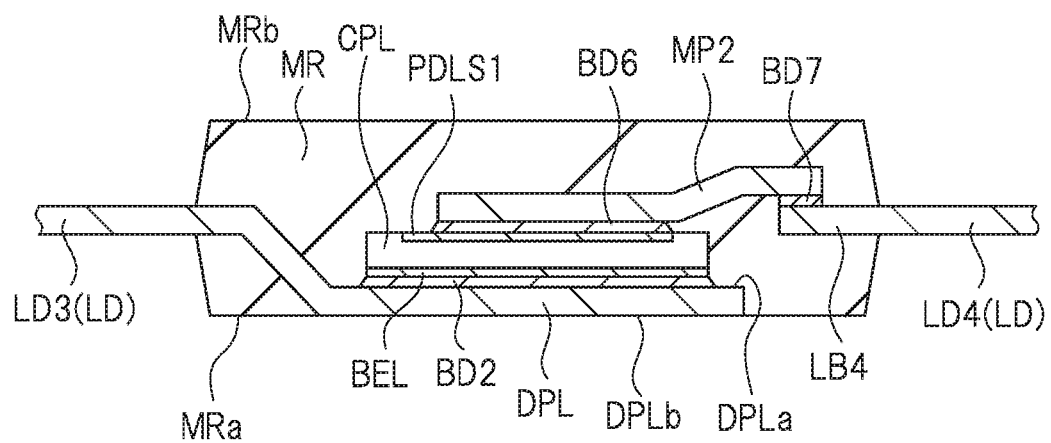
FIG. 26 is a cross-sectional view of the semiconductor device in the same manufacturing process as FIG. 25.
Figure 27:
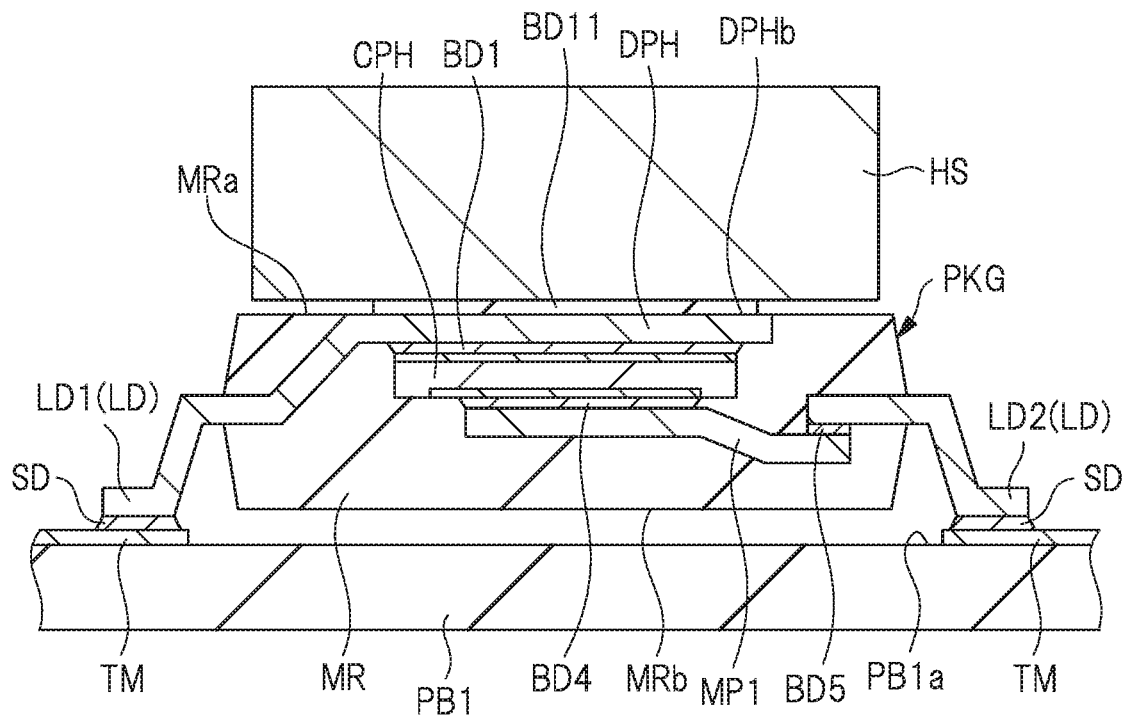
FIG. 27 is a cross-sectional view showing a mounting example of the semiconductor device according to the embodiment.
Figure 28:
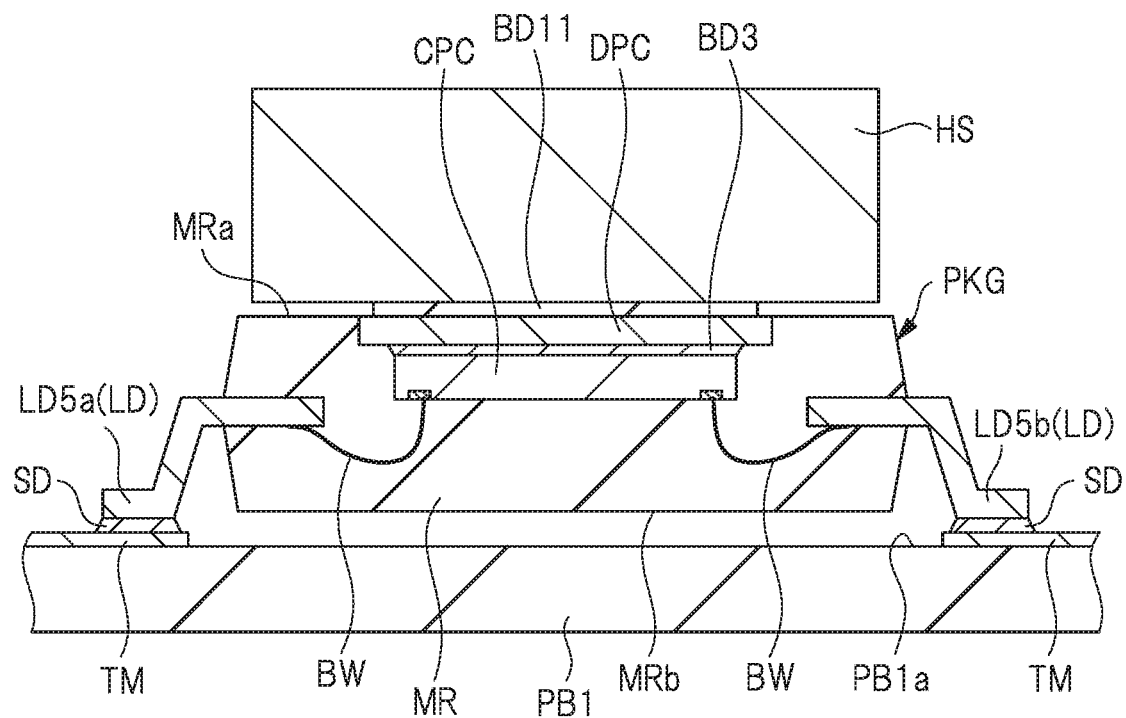
FIG. 28 is a cross-sectional view showing the mounting example of the semiconductor device according to the embodiment.
Figure 29:
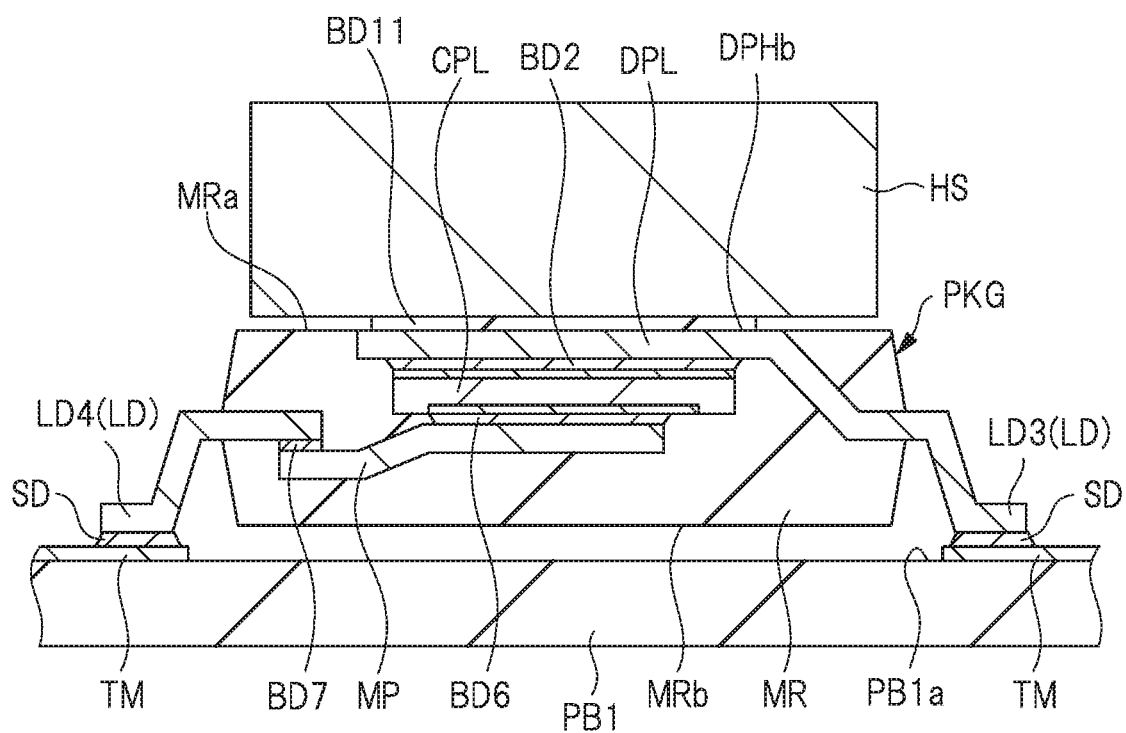
FIG. 29 is a cross-sectional view showing the mounting example of the semiconductor device according to the embodiment.

Next, the molding process (process of forming sealing portion MR) is performed. Specifically, first, as shown in FIGS. 21 and 22, the lead frame LF is sandwiched by a molding die (lower molding die) KG1 and a molding die (upper molding die) KG2. At this time, the lead frame LF is sandwiched by the molding die KG1 and the molding die KG2 such that the die pads DPH, DPL, and DPC, the semiconductor chips CPH, CPL, and CPC, the metal plates MP1 and MP2, the wires BW, the inner lead portions of the leads LD, and the lead coupling portions LB1, LB2, LB3, and LB4 are arranged in a cavity CAV between the molding dies KG1 and KG2. Each of the back surfaces DPCb, DPHb, and DPLb of the die pads DPH, DPL, and DPC is in contact with the upper surface of the molding die KG1. The outer lead portions of the leads LD are located outside the cavity CAV and sandwiched between the molding die KG1 and the molding die KG2. Then, as shown in FIG. 23 and FIG. 24, a resin material MR1 for forming the sealing portion MR is injected (introduced) into the cavity CAV between the molding dies KG1 and KG2. The resin material MR1 to be injected is made of, for example, a thermosetting resin material, and can contain filler or the like. Thereafter, the process of curing the resin material MR1 injected into the cavity CAV (heat treatment) is performed. Consequently, the sealing portion MR made of the cured resin material MR1 is formed. Then, the molding die KG1 and the molding die KG2 are separated, and the lead frame LF is taken out together with the sealing portion MR as shown in FIG. 25 and FIG. 26.

By the molding process described above, the sealing portion MR in which the semiconductor chips CPC, CPH, and CPL, the die pads DPC, DPH, and DPL, the plurality of wires BW, the metal plates MP1 and MP2, the lead coupling portions LB1, LB2, LB3, and LB4, and the inner lead portions of the plurality of leads LD are sealed is formed. As can be seen from FIG. 25 and FIG. 26, the sealing portion MR is formed in the molding process such that the back surfaces DPCb, DPHb, and DPLb of the die pads DPC, DPH, and DPL are exposed from the main surface MRa of the sealing portion MR.

Note that the processes up to this molding process are performed in the state where the main surfaces DPCa, DPHa, and DPLa of the die pads DPC, DPH, and DPL are directed upward. Therefore, at the stage where the sealing portion MR is formed by performing the molding process, the back surface MRb of the sealing portion MR is directed upward. However, when the manufactured semiconductor device PKG is mounted on the wiring board or the like, the semiconductor device PKG is mounted on the wiring board such that the back surface MRb of the sealing portion MR faces the wiring board.

Next, a plating layer (not shown) is formed on each of the outer lead portions of the leads LD exposed from the sealing portion MR as needed. Thereafter, the top and bottom (front and back) of the lead frame LF are inverted together with the sealing portion MR, and then the leads LD are cut at predetermined positions outside the sealing portion MR and separated from the frame body of the lead frame LF.

Next, the outer lead portions of the leads LD projecting from the sealing portion MR are bent (lead processing, lead forming).

In the manner described above, the semiconductor device PKG shown in FIGS. 2 to 10 is manufactured.

<Mounting Example of Semiconductor Device PKG>

FIGS. 27 to 30 are cross-sectional views showing the state where the semiconductor device PKG is mounted on a wiring board PB1. Note that FIG. 27 corresponds to the cross-sectional view at the cross-sectional position corresponding to FIG. 7, FIG. 28 corresponds to the cross-sectional view at the cross-sectional position corresponding to FIG. 8, FIG. 29 corresponds to the cross-sectional view at the cross-sectional position corresponding to FIG. 9, and FIG. 30 corresponds to the cross-sectional view at the cross-sectional position corresponding to FIG. 10.

As shown in FIGS. 27 to 30, the semiconductor device PKG is mounted on a main surface PB1a of the wiring board PB1, with the back surface MRb of the sealing portion MR being directed to the main surface (upper surface) PB1a of the wiring board PB1. Also, the plurality of leads LD of each semiconductor device PKG are bonded and fixed to a plurality of terminals (electrodes) TM formed on the main surface PB1a of the wiring board PB1 via conductive bonding materials SD such as solder. Namely, the plurality of leads LD of each semiconductor device PKG are electrically connected to the plurality of terminals TM formed on the main surface PB1a of the wiring board PB1 via the conductive bonding materials SD. The bonding material SD is preferably made of solder.

In addition, in the case of FIGS. 27 to 30, a heat sink (chassis) HS is arranged (mounted) via an insulating adhesive material BD11 on the main surface MRa of the sealing portion MR of the semiconductor device PKG mounted on the wiring board PB1. As the insulating adhesive material BD11, for example, a heat conductive grease having an insulating property can be used. As the heat sink HS, for example, a fin type heat sink can be used.

In the semiconductor device PKG, the back surfaces DPCb, DPHb, and DPLb of the die pads DPC, DPH, and DPL are exposed from the main surface MRa of the sealing portion MR, and the back surfaces DPCb, DPHb, and DPLb of the die pads DPC, DPH, and DPL are bonded to the head sink HS via the insulating bonding material BD11. Consequently, the heat generated in the semiconductor chips CPC, CPH, and CPL in the semiconductor device PKG can be dissipated to the heat sink HS through the die pads DPC, DPH, and DPL and the adhesive material BD11 (heat conductive grease).

Also, by using the insulating adhesive material BD11 for attaching the heat sink HS to the semiconductor device PKG, the heat sink HS with a large heat capacity (large volume) can be attached to the semiconductor device PKG while preventing the die pads DPC, DPH, and DPL of the semiconductor device PKG from being electrically connected to each other through the adhesive material BD11 and the heat sink HS.

<Main Feature and Effect>

The main feature of this embodiment lies in the proper setting of an elastic modulus of the bonding materials (adhesive layers) BD1, BD2, BD3, BD4, BD5, BD6, and BD7 in the semiconductor device PKG. Specifically, the elastic modulus of each of the bonding materials BD1, BD2, BD3, BD4, and BD6 is lower than that of each of the bonding materials BD5 and BD7. Namely, the bonding materials BD1, BD2, BD3, BD4, and BD6 have a low elastic modulus, and the bonding materials BD5 and BD7 have a high elastic modulus. In other words, the low-elastic bonding material is used as the bonding materials BD1, BD2, BD3, BD4, and BD6, and the high-elastic bonding material is used as the bonding materials BD5 and BD7.

Note that the bonding materials BD1, BD2, BD3, BD4, BD5, BD6, and BD7 have conductivity, while the bonding material BD3 may be conductive or insulative depending on cases. However, it is more preferable that the bonding material BD3 (BD3a) is made of the same material as that of the bonding materials BD1 and BD2 (BD1a, BD2a). Consequently, the manufacturing process of the semiconductor device PKG (more specifically, die bonding process) can be simplified, and the manufacturing cost of the semiconductor device PKG can be reduced. When the bonding material BD3 (BD3a) is made of the same material as that of the bonding materials BD1 and BD2 (BD1a, BD2a), the bonding material BD3 also has conductivity.

FIG. 31 is a table in which characteristics of a low-elastic bonding material and a high-elastic bonding material are summarized for comparison, and shows the case where both of the low-elastic bonding material and the high-elastic bonding material are made of silver paste.

The low-elastic bonding material has a lower elastic modulus than that of the high-elastic bonding material. Also, as can be seen from the table of FIG. 31, the low-elastic bonding material has a lower silver (Ag) content than that of the high-elastic bonding material. This is because when the ratio of silver (Ag) in the bonding material is lowered, the ratio of the resin component in the bonding material is increased and the elastic modulus is decreased accordingly.

Also, as can be seen from the table of FIG. 31, the low-elastic bonding material has a lower thermal conductivity and a higher volume resistivity (electric resistivity) than those of the high-elastic bonding material. This is because when the silver (Ag) content is low, the thermal conductivity is reduced and the volume resistivity (electric resistivity) is increased, so that the low-elastic bonding material having a lower silver (Ag) content as compared with the high-elastic bonding material having a higher silver (Ag) content has a low thermal conductivity and a high volume resistivity.

In consideration of the characteristics of each of the low-elastic bonding material and the high-elastic bonding material, in this embodiment, the high-elastic bonding material is applied to the bonding materials BD5 and BD7, and the low-elastic bonding material is applied to the bonding materials BD1, BD2, BD3, BD4, and BD6. As a result, the overall reliability of the semiconductor device PKG can be improved, and the reasons for this will be specifically described below.

First, attention is paid to the bonding materials BD1, BD2, and BD3. Each of the bonding materials BD1, BD2, and BD3 is the bonding material for bonding the semiconductor chip (CPH, CPL, CPC) to the die pad (DPH, DPL, DPC). As described above, since the semiconductor chips CPH and CPL are both semiconductor chips in which a field effect transistor (power transistor) for switching is formed, a large amount of heat is generated during operation. Therefore, the semiconductor chips CPH and CPL can be heat sources. Also, since the die pad (DPH, DPL, DPC) and the semiconductor chip (CPH, CPL, CPC) are made of different materials, the thermal expansion coefficient of the die pad (DPH, DPL, DPC) and the thermal expansion coefficient of the semiconductor chip (CPH, CPL, CPC) are different from each other. Therefore, when the temperatures of the semiconductor chips CPH and CPL, the bonding materials BD1 and BD2, and the die pads DPH and DPL are increased due to the heat generation during the operation of the semiconductor chips CPH and CPL, the strong stress is generated in the bonding materials BD1 and BD2 interposed between the die pads DPH and DPL and the semiconductor chips CPH and CPL due to the difference in thermal expansion coefficient between the die pads DPH and DPL and the semiconductor chips CPH and CPL. This stress may lead to the occurrence of cracks in the bonding materials BD1 and BD2. Since the occurrence of cracks in the bonding materials BD1 and BD2 interposed between the die pads DPH and DPL and the semiconductor chips CPH and CPL may cause the reduction in reliability of the semiconductor device PKG, it is desirable to prevent it.

Thus, in this embodiment, it is preferable that the elastic modulus of the bonding materials BD1 and BD2 is reduced, and it is thus preferable that the low-elastic bonding material is applied as the bonding materials BD1 and BD2. When the elastic modulus of the bonding materials BD1 and BD2 is reduced, the cracks are less likely to occur in the bonding materials BD1 and BD2 even if the temperatures of the semiconductor chips CPH and CPL, the bonding materials BD1 and BD2, and the die pads DPH and DPL are increased due to the heat generation of the semiconductor chips CPH and CPL and the stress due to the difference in thermal expansion coefficient between the die pads DPH and DPL and the semiconductor chips CPH and CPL is generated in the bonding materials BD1 and BD2. Namely, when the case where the elastic modulus of the bonding materials BD1 and BD2 is low and the case where the elastic modulus thereof is high are compared, the cracks caused by the stress generated in the bonding materials BD1 and BD2 due to the heat generation in the semiconductor chips CPH and CPL are less likely to occur in the bonding materials BD1 and BD2 in the case where the elastic modulus of the bonding materials BD1 and BD2 is low. By reducing the elastic modulus of the bonding materials BD1 and BD2, the stress (strain) to be generated in the bonding materials BD1 and BD2 due to the difference in thermal expansion coefficient between the die pads DPH and DPL and the semiconductor chips CPH and CPL when the semiconductor chips CPH and CPL generate heat can be suppressed, so that the occurrence of cracks in the bonding materials BD1 and BD2 can be suppressed. Since the occurrence of cracks in the bonding materials BD1 and BD2 can be suppressed, the reliability of the semiconductor device PKG can be improved. For example, when the cracks occur in the bonding materials BD1 and BD2, the connection resistance between the back surface electrode BEH of the semiconductor chip CPH and the die pad DPH and the connection resistance between the back surface electrode BEL of the semiconductor chip CPL and the die pad DPL increase, resulting in the increase in the on resistance (resistance at conduction) of the power MOSFETs 1 and 2. Also, when the cracks occur in the bonding materials BD1 and BD2, the ratio (sense ratio) between the current flowing in the sense MOSFETs 3 and 4 and the current flowing in the power MOSFETs 1 and 2 varies, so that the sensing accuracy of the current of the power MOSFETs 1 and 2 by the sense MOSFETs 3 and 4 is decreased. Since the elastic modulus of the bonding materials BD1 and BD2 is reduced in this embodiment, the occurrence of cracks in the bonding materials BD1 and BD2 can be suppressed, and it is thus possible to prevent such a problem.

The amount of heat generated in the semiconductor chip CPC during operation is smaller as compared with those of the semiconductor chips CPH and CPL. Therefore, there is low risk of the occurrence of cracks in the bonding material BD3 even when the elastic modulus of the bonding material BD3 is not reduced. Thus, any of the low-elastic bonding material and the high-elastic bonding material may be applied to the bonding material BD3. Further, the bonding material BD3 may be conductive or insulative. However, in the manufacture of the semiconductor device PKG, it is preferable that the same material as that of the bonding materials BD1 and BD2 (BD1a, BD2a) is used to form the bonding material BD3 (BD3a), and it is thus preferable that the low-elastic bonding material is applied to the bonding material BD3 similarly to the bonding materials BD1 and BD2. By using the same material as that of the bonding materials BD1 and BD2 (BD1a, BD2a) to form the bonding material BD3 (BD3a), the manufacturing process of the semiconductor device PKG (more specifically, die bonding process) can be simplified, and the manufacturing cost of the semiconductor device PKG can be reduced.

Next, attention is paid to the bonding materials BD4 and BD6. The bonding materials BD4 and BD6 are the bonding materials for bonding the metal plates MP1 and MP2 to the pads PDHS1 and PDLS1 of the semiconductor chips CPH and CPL. As described above, the amount of heat generated in the semiconductor chips CPH and CPL is large, and the semiconductor chips CPH and CPL can be heat sources. Also, since the metal plates MP1 and MP2 and the semiconductor chips CPH and CPL are made of different materials, the thermal expansion coefficient of the metal plates MP1 and MP2 and the thermal expansion coefficient of the semiconductor chips CPH and CPL are different from each other. Therefore, when the temperatures of the semiconductor chips CPH and CPL, the bonding materials BD4 and BD6, and the metal plates MP1 and MP2 are increased due to the heat generation during the operation of the semiconductor chips CPH and CPL, the strong stress is generated in the bonding materials BD4 and BD6 interposed between the metal plates MP1 and MP2 and the semiconductor chips CPH and CPL due to the difference in thermal expansion coefficient between the metal plates MP1 and MP2 and the semiconductor chips CPH and CPL. This stress may lead to the occurrence of cracks in the bonding materials BD4 and BD6. Since the occurrence of cracks in the bonding materials BD4 and BD6 interposed between the metal plates MP1 and MP2 and the pads PDHS1 and PDLS1 of the semiconductor chips CPH and CPL may cause the reduction in reliability of the semiconductor device PKG, it is desirable to prevent it.

Thus, in this embodiment, it is preferable that the elastic modulus of the bonding materials BD4 and BD6 is reduced, and it is thus preferable that the low-elastic bonding material is applied as the bonding materials BD4 and BD6. When the elastic modulus of the bonding materials BD4 and BD6 is reduced, the cracks are less likely to occur in the bonding materials BD4 and BD6 even if the temperatures of the semiconductor chips CPH and CPL, the bonding materials BD4 and BD6, and the metal plates MP1 and MP2 are increased due to the heat generation of the semiconductor chips CPH and CPL and the stress due to the difference in thermal expansion coefficient between the metal plates MP1 and MP2 and the semiconductor chips CPH and CPL is generated in the bonding materials BD4 and BD6. Namely, when the case where the elastic modulus of the bonding materials BD4 and BD6 is low and the case where the elastic modulus thereof is high are compared, the cracks caused by the stress generated in the bonding materials BD4 and BD6 due to the heat generation in the semiconductor chips CPH and CPL are less likely to occur in the bonding materials BD4 and BD6 in the case where the elastic modulus of the bonding materials BD4 and BD6 is low. By reducing the elastic modulus of the bonding materials BD4 and BD6, the stress (strain) to be generated in the bonding materials BD4 and BD6 due to the difference in thermal expansion coefficient between the metal plates MP1 and MP2 and the semiconductor chips CPH and CPL when the semiconductor chips CPH and CPL generate heat can be suppressed, so that the occurrence of cracks in the bonding materials BD4 and BD6 can be suppressed. Since the occurrence of cracks in the bonding materials BD4 and BD6 can be suppressed, the reliability of the semiconductor device PKG can be improved. For example, when the cracks occur in the bonding materials BD4 and BD6, the connection resistance between the pad PDHS1 of the semiconductor chip CPH and the metal plate MP1 and the connection resistance between the pad PDSL1 of the semiconductor chip CPL and the metal plate MP2 increase, resulting in the increase in the on resistance (resistance at conduction) of the power MOSFETs 1 and 2. Since the elastic modulus of the bonding materials BD4 and BD6 is reduced in this embodiment, the occurrence of cracks in the bonding materials BD4 and BD6 can be suppressed, and it is thus possible to prevent such a problem.

Next, attention is paid to the bonding materials BD5 and BD7. The bonding materials BD5 and BD7 are the bonding materials for bonding the metal plates MP1 and MP2 to the lead coupling portions LB2 and LB4. As described above, the amount of heat generated in the semiconductor chips CPH and CPL is large, and the semiconductor chips CPH and CPL can be heat sources. Since the metal plates MP1 and MP2 are bonded to the pads PDHS1 and PDLS1 of the semiconductor chips CPH and CPL via the bonding materials BD4 and BD6, the heat generated in the semiconductor chips CPH and CPL is transmitted to the metal plates MP1 and MP2 through the bonding materials BD4 and BD6 and is further transmitted to the lead coupling portions LB2 and LB4 through the bonding materials BD5 and BD7. However, the metal plates MP1 and MP2 and the lead coupling portions LB2 and LB4 are made of the same material (same metal material). The metal plates MP1 and MP2 and the lead coupling portions LB2 and LB4 are preferably made of copper or copper alloy. Therefore, the thermal expansion coefficient of the metal plates MP1 and MP2 and the thermal expansion coefficient of the lead coupling portions LB2 and LB4 are substantially equal to each other. Accordingly, even when the heat generated in the semiconductor chips CPH and CPL is transmitted to the metal plates MP1 and MP2 and the lead coupling portions LB2 and LB4 and the temperatures of the metal plates MP1 and MP2, the bonding materials BD5 and BD7, and the lead coupling portions LB2 and LB4 increase, the stress generated in the bonding materials BD5 and BD7 interposed between the metal plates MP1 and MP2 and the lead coupling portions LB4 and LB4 does not increase so much. Thus, even when the heat generated in the semiconductor chips CPH and CPL is transmitted to the metal plates MP1 and MP2 and the lead coupling portions LB2 and LB4, there is low risk of the occurrence of cracks in the bonding materials BD5 and BD7 interposed between the metal plates MP1 and MP2 and the lead coupling portions LB2 and LB4. Namely, when the bonding material with the same elastic modulus is used for all of the bonding materials BD1, BD2, BD3, BD4, BD5, BD6, and BD7 unlike this embodiment, the risk of the occurrence of cracks in the bonding materials BD5 and BD7 due to the heat generated in the semiconductor chips CPH and CPL is quite smaller than the risk of the occurrence of cracks in the bonding materials BD1, BD2, BD3, BD4, and BD6 due to the heat generated in the semiconductor chips CPH and CPL.

As described above, in order to reduce the risk of the occurrence of cracks in the bonding materials BD1, BD2, BD3, BD4, and BD6 due to the heat generated in the semiconductor chips CPH and CPL, it is desirable to reduce the elastic modulus of the bonding materials BD1, BD2, BD3, BD4, and BD6. On the other hand, since the risk of the occurrence of cracks in the bonding materials BD5 and BD7 due to the heat generated in the semiconductor chips CPH and CPL is originally low, it is not necessary to reduce the elastic modulus of the bonding materials BD5 and BD7 for the purpose of preventing the cracks due to the heat generated in the semiconductor chips CPH and CPL. Instead, it is desirable to increase the elastic modulus of the bonding materials BD5 and BD7 for the following reasons.

Namely, the bonding area (planar area of bonding material BD5) between the metal plate MP1 and the lead coupling portion LB2 is smaller than the bonding area (planar area of bonding material BD1) between the semiconductor chip CPH and the die pad DPH and the bonding area (planar area of bonding material BD2) between the semiconductor chip CPL and the die pad DPL. Also, the bonding area (planar area of bonding material BD5) between the metal plate MP1 and the lead coupling portion LB2 is smaller than the bonding area (planar area of bonding material BD4) between the metal plate MP1 and the pad PDHS1 of the semiconductor chip CPH and the bonding area (planar area of bonding material BD6) between the metal plate MP2 and the pad PDLS1 of the semiconductor chip CPL. In addition, the bonding area (planar area of bonding material BD7) between the metal plate MP2 and the lead coupling portion LB4 is smaller than the bonding area (planar area of bonding material BD1) between the semiconductor chip CPH and the die pad DPH and the bonding area (planar area of bonding material BD2) between the semiconductor chip CPL and the die pad DPL. Further, the bonding area (planar area of bonding material BD7) between the metal plate MP2 and the lead coupling portion LB4 is smaller than the bonding area (planar area of bonding material BD4) between the metal plate MP1 and the pad PDHS1 of the semiconductor chip CPH and the bonding area (planar area of bonding material BD6) between the metal plate MP2 and the pad PDLS1 of the semiconductor chip CPL. Namely, although the planar size (planar area) of each of the bonding materials BD1, BD2, BD3, BD4, and BD6 is relatively large, the planar size (planar area) of each of the bonding materials BD5 and BD7 is relatively small when compared. Therefore, if the electric resistivity (volume resistivity) of the bonding materials BD5 and BD7 with the small planar size (planar area) is low, the connection resistance between the metal plate MP1 and the lead coupling portion LB2 via the bonding material BD5 and the connection resistance between the metal plate MP2 and the lead coupling portion LB4 via the bonding material BD7 increase, and this is undesirable.

Thus, as to the bonding materials BD5 and BD7 with the planar size (planar area) smaller than those of the bonding materials BD1, BD2, BD3, BD4, and BD6, it is preferable to reduce the electric resistivity (volume resistivity) and thus to use the high-elastic bonding material. As described above, since the high-elastic bonding material has a high silver content and thus has low electric resistivity (volume resistivity), the electric resistivity (volume resistivity) of the bonding materials BD5 and BD7 can be reduced by using the high-elastic bonding material for the bonding materials BD5 and BD7. Consequently, it is possible to suppress the connection resistance between the metal plate MP1 and the lead coupling portion LB2 via the bonding material BD5 and the connection resistance between the metal plate MP2 and the lead coupling portion LB4 via the bonding material BD7. Therefore, the performance of the semiconductor device PKG can be improved.

Meanwhile, even when the electric resistivity (volume resistivity) of the bonding materials BD1, BD2, BD3, BD4, and BD6 increases by using the low-elastic bonding material, the planar size (planar area) of the bonding materials BD1, BD2, BD3, BD4, and BD6 is relatively large, and thus the resistance (conduction resistance) of each of the bonding materials BD1, BD2, BD3, BD4, and BD6 can be suppressed. Therefore, it is possible to reduce the connection resistance between the back surface electrode BEH of the semiconductor chip CPH and the die pad DPH, the connection resistance between the back surface electrode BEL of the semiconductor chip CPL and the die pad DPL, the connection resistance between the metal plate MP1 and the pad PDHS1 of the semiconductor chip CPH, and the connection resistance between the metal plate MP2 and the pad PDLS1 of the semiconductor chip CPL.

Therefore, it is preferable to use the low-elastic bonding material for the bonding materials BD1, BD2, BD3, BD4, and BD6 in order to reduce the risk of the occurrence of cracks in the bonding materials BD1, BD2, BD3, BD4, and BD6 due to the heat generated in the semiconductor chips CPH and CPL. Meanwhile, it is preferable to use the high-elastic bonding material for the bonding materials BD5 and BD7 in order to suppress the connection resistance between the metal plate MP1 and the lead coupling portion LB2 via the bonding material BD5 and the connection resistance between the metal plate MP2 and the lead coupling portion LB4 via the bonding material BD7.

Another reason why it is desirable to apply the high-elastic bonding material as the bonding materials BD5 and BD7 will be further described.

The lead frame LF is sandwiched between the molding die KG1 and the molding die KG2 in the molding process (process of forming sealing portion MR), and the outer lead portion of each lead LD is sandwiched between the molding die KG1 and the molding die KG2 at this time. The lead coupling portion LB2 is integrally formed with the lead LD2 and the lead coupling portion LB4 is integrally formed with the lead LD4, and the outer lead portions of the leads LD2 and LD4 are also sandwiched between the molding die KG1 and the molding die KG2 (see FIG. 21 and FIG. 22). Since the lead LD2 and the lead coupling portion LB2 are integrally formed, the stress is generated in the bonding material BD5 that bonds the lead coupling portion LB2 and the metal plate MP1 because the position of the lead LD2 is slightly moved when the outer lead portion of the lead LD2 is sandwiched between the molding die KG1 and the molding die KG2. For the same reason, the stress is generated in the bonding material BD7 that bonds the lead coupling portion LB4 and the metal plate MP2. Further, when the lead frame LF is sandwiched between the molding die KG1 and the molding die KG2, the molding die KG1 and the molding die KG2 are heated to a predetermined temperature, for example, 160 to 190° C., more preferably, about 170 to 180° C. The heating temperature of the molding die KG1 and the molding die KG2 is higher than the temperature reached when the temperatures of the semiconductor chips CPH and CPL increase due to the heat generated in the semiconductor chips CPH and CPL during the operation of the semiconductor device PKG (reached temperature of semiconductor chips CPH and CPL). Therefore, when the lead frame LF is sandwiched between the molding die KG1 and the molding die KG2, the stress is generated in the bonding materials BD5 and BD7, and the bonding materials BD5 and BD7 are heated.

Both of the high-elastic bonding material and the low-elastic bonding material tend to soften and weaken in strength at high temperature, but the high-elastic bonding material has lower degree of reduction in strength at high temperature than the low-elastic bonding material, and thus the high-elastic bonding material has higher strength at high temperature than the low-elastic bonding material. This is because the high-elastic bonding material has a higher silver (Ag) content and a lower ratio of a resin component than the low-elastic bonding material, and the degree of reduction in strength at high temperature is smaller in the high-elastic bonding material having a low ratio of a resin component than in the low-elastic bonding material having a high ratio of a resin component. Accordingly, it is preferable to use the high-elastic bonding material as the bonding materials BD5 and BD7, and it is thus possible to increase the strength of the bonding materials BD5 and BD7 at high temperature. Consequently, even if the stress is generated in the bonding material BD5 that bonds the lead coupling portion LB2 and the metal plate MP1 and the bonding material BD7 that bonds the lead coupling portion LB4 and the metal plate MP2 when the lead frame LF is sandwiched between the molding die KG1 and the molding die KG2 in the molding process, the occurrence of the problem (for example, breakage of bonding materials BD5 and BD7) due to the stress can be suppressed or prevented. Therefore, the manufacturing yield of the semiconductor device PKG can be improved, and the manufacturing cost of the semiconductor device PKG can be reduced. Also, the reliability of the semiconductor device PKG can be improved.

On the other hand, the stress generated in the bonding materials BD1, BD2, BD3, BD4, and BD6 is relatively small in comparison with the stress generated in the bonding materials BD5 and BD7 when the lead frame LF is sandwiched between the molding die KG1 and the molding die KG2 in the molding process. This is because the back surfaces DPCb, DPHb, and DPLb of the die pads DPH, DPL, and DPC in the lead frame LF arranged on the molding die KG1 are in contact with the upper surface of the molding die KG1, and thus the positions of the die pads DPH, DPL, and DPC and the semiconductor chips CPH, CPL, and CPC mounted thereon are stable. Therefore, the stress generated by sandwiching the outer lead portions of the leads LD of the lead frame LF between the molding die KG1 and the molding die KG2 in the molding process is relatively small in the bonding materials BD1, BD2, BD3, BD4, and BD6. Accordingly, it is not necessary to apply the high-elastic bonding material to the bonding materials BD1, BD2, BD3, BD4, and BD6 in consideration of the stress generated by sandwiching the outer lead portions of the leads LD of the lead frame LF between the molding die KG1 and the molding die KG2 in the molding process.

Also, by sandwiching the leaf frame LF in the molding process, the temperatures of the die pads DPH, DPL, and DPC, the semiconductor chips CPH, CPL, and CPC, the metal plates MP1 and MP2, and the bonding materials BD1, BD2, BD3, BD4, and BD6 increase. As a result, there is a possibility that the stress due to the difference in thermal expansion coefficient between the die pads DPH, DPL, and DPC and the semiconductor chips CPH, CPL, and CPC may be generated in the bonding materials BD1, BD2, and BD3, and there is a possibility that the stress due to the difference in thermal expansion coefficient between the semiconductor chips CPH and CPL and the metal plates MP1 and MP2 may be generated in the bonding materials BD4 and BD6. However, since the low-elastic bonding material is used for the bonding materials BD1, BD2, and BD3, it is possible to suppress the generation of the stress due to the difference in thermal expansion coefficient between the die pads DPH, DPL, and DPC and the semiconductor chips CPH, CPL, and CPC in the bonding materials BD1, BD2, and BD3 in the molding process. Also, since the low-elastic bonding material is used for the bonding materials BD4 and BD6, it is possible to suppress the generation of the stress due to the difference in thermal expansion coefficient between the semiconductor chips CPH and CPL and the metal plates MP1 and MP2 in the bonding materials BD4 and BD6 in the molding process. Consequently, it is possible to suppress or prevent the occurrence of the problem (for example, breakage) in the bonding materials BD1, BD2, BD3, BD4, and BD6 in the molding process.

On the other hand, since the lead coupling portion LB2 is separated from the molding dies KG1 and KG2 and is in the floating state, the position thereof is not stable. Therefore, the stress generated by sandwiching the outer lead portions of the leads LD of the lead frame LF between the molding die KG1 and the molding die KG2 in the molding process is relatively large in the bonding materials BD5 and BD7 in comparison with the bonding materials BD1, BD2, BD3, BD4, and BD6. Therefore, it is desirable to increase the strength at high temperature in the bonding materials BD5 and BD7, and the high-elastic bonding material is preferably used to achieve it. Further, since the metal plates MP1 and MP2 and the lead coupling portions LB2 and LB4 are made of the same material, the stress due to the difference in thermal expansion coefficient between the metal plates MP1 and MP2 and the lead coupling portions LB2 and LB4 is scarcely generated in the bonding materials BD5 and BD7 in the molding process.

For the reasons described above, the elastic modulus is properly set for the bonding materials BD1, BD2, BD3, BD4, BD5, BD6, and BD7 in the semiconductor device PKG. As described above, it is preferable that the low-elastic bonding material is applied to the bonding materials BD1, BD2, BD3, BD4, and BD6 and the elastic modulus of each of the bonding materials BD1, BD2, BD3, BD4, and BD6 is low. Meanwhile, it is preferable that the high-elastic bonding material is applied to the bonding materials BD5 and BD7 and the elastic modulus of each of the bonding materials BD5 and BD7 is high.

Therefore, as the main feature of this embodiment, the elastic modulus of each of the bonding materials BD1, BD2, BD3, BD4, and BD6 is made lower than that of each of the bonding materials BD5 and BD7. In other words, the elastic modulus of each of the bonding materials BD5 and BD7 is made higher than that of each of the bonding materials BD1, BD2, BD3, BD4, and BD6. Consequently, since the elastic modulus of each of the bonding materials BD1, BD2, BD3, BD4, and BD6 can be reduced and the elastic modulus of each of the bonding materials BD5 and BD7 can be increased, the effect described above can be obtained, and the overall reliability and performance of the semiconductor device PKG can be improved.

Also, it is preferable that the same (common) bonding material is used for the bonding materials BD1, BD2, BD3, BD4, and BD6. Namely, it is preferable that the same (common) bonding material is used as the bonding materials BD1a, BD2a, BD3a, BD4a, and BD6a described above. Consequently, the manufacturing process of the semiconductor device PKG can be simply performed and the manufacturing cost of the semiconductor device can be reduced. Note that, when the same bonding material is used for the bonding materials BD1, BD2, BD3, BD4, and BD6, the elastic modulus of the bonding material BD1, the elastic modulus of the bonding material BD2, the elastic modulus of the bonding material BD3, the elastic modulus of the bonding material BD4, and the elastic modulus of the bonding material BD6 are almost equal to one another.

Also, it is preferable that the same (common) bonding material is used for the bonding materials BD5 and BD7. Namely, it is preferable that the same (common) bonding material is used as the bonding materials BD5a and BD7a described above. Consequently, the manufacturing process of the semiconductor device PKG can be simply performed and the manufacturing cost of the semiconductor device can be reduced. Note that, when the same bonding material is used for the bonding materials BD5 and BD7, the elastic modulus of the bonding material BD5 and the elastic modulus of the bonding material BD7 are almost equal to each other.

Further, it is more preferable that the elastic modulus (elastic modulus at 25° C.) of each of the bonding materials BD1, BD2, BD3, BD4, and BD6 is about 1 to 3 GPa (gigapascal). In addition, it is more preferable that the elastic modulus (elastic modulus at 25° C.) of each of the bonding materials BD5 and BD7 is about 10 to 20 GPa. Consequently, the bonding materials BD1, BD2, BD3, BD4, BD5, BD6, and BD7 can be optimized, and the effect described above can be accurately obtained.

As described above, in the case of the silver paste, the silver content and the elastic modulus are associated with each other, and the elastic modulus becomes lower as the silver content is reduced. Therefore, the main feature of this embodiment is to make the elastic modulus of each of the bonding materials BD1, BD2, BD3, BD4, and BD6 lower than that of each of the bonding materials BD5 and BD7, and this can be expressed in another way as follows. Namely, when the main feature of this embodiment is expressed in another way, the silver paste (silver paste bonding material) is used as the bonding materials BD1, BD2, BD3, BD4, BD5, BD6, and BD7, and the silver (Ag) content of each of the bonding materials BD1, BD2, BD3, BD4, and BD5 is made lower than the silver (Ag) content of each of the bonding materials BD5 and BD7. Consequently, since the elastic modulus of each of the bonding materials BD1, BD2, BD3, BD4, and BD6 can be reduced and the elastic modulus of each of the bonding materials BD5 and BD7 can be increased, the effect described above can be obtained, and the overall performance and reliability of the semiconductor device PKG can be improved.

It is more preferable that the silver (Ag) content of each of the bonding materials BD1, BD2, BD3, BD4, and BD6 is about 82 to 88 weight % (wt %). Also, it is more preferable that the silver (Ag) content of each of the bonding materials BD5 and BD7 is about 90 to 96 weight %. Consequently, the bonding materials BD1, BD2, BD3, BD4, BD5, BD6, and BD7 can be optimized, and the above-described effect can be obtained accurately.

For the simplification of the manufacturing process of the semiconductor device, it is more advantageous that the same (common) material is used for all of the bonding materials BD1, BD2, BD3, BD4, BD5, BD6, and BD7 unlike this embodiment. In this case, however, all of the bonding materials BD1, BD2, BD3, BD4, BD5, BD6, and BD7 are formed to have a low elastic modulus or all of the bonding materials BD1, BD2, BD3, BD4, BD5, BD6, and BD7 are formed to have a high elastic modulus. If the elastic modulus of all of the bonding materials BD1, BD2, BD3, BD4, BD5, BD6, and BD7 is high, there is risk of the occurrence of the problem (cracks) in the bonding materials BD1, BD2, BD3, BD4, and BD6 due to the heat generated during the operation of the semiconductor chips CPH and CPL. Meanwhile, if the elastic modulus of all of the bonding materials BD1, BD2, BD3, BD4, BD5, BD6, and BD7 is low, there is risk of the occurrence of the above-described problem (increase in connection resistance and occurrence of breakage in molding process) in the bonding materials BD5 and BD7. The inventors of this application have studied about the problems that occur depending on the difference in elastic modulus for each of the bonding materials BD1, BD2, BD3, BD4, BD5, BD6, and BD7, and as a result, the configuration in which the elastic modulus of each of the bonding materials BD1, BD2, BD3, BD4, and BD6 is made lower than that of each of the bonding materials BD5 and BD7 like this embodiment is adopted. It can be said that this can be achieved because the problems that occur depending on the difference in elastic modulus have been studied for each of the bonding materials BD1, BD2, BD3, BD4, BD5, BD6, and BD7.

Also, the case where the semiconductor chips CPH, CPL, and CPC are sealed and packaged together has been described in this embodiment. As another embodiment, the semiconductor chips CPH, CPL, and CPC may be separately sealed and packaged. In this case, for example, the cross-sectional structure of the semiconductor device (semiconductor package) including the semiconductor chip CPH is the same as that shown in FIG. 7, and this semiconductor device includes the semiconductor chip CPH, the die pad DPH, the metal plate MP1, the plurality of leads LD (including the leads LD1, LD2, and LD6), the lead coupling portions LB1 and LB2, the bonding materials BD1, BD4, and BD5, and the sealing portion MR that seals them. In this case, the pads PDHA, PDHC, PDHG, and PDHS2 of the semiconductor chip CPH are electrically connected to the leads LD through the wires BW. Also in this case, the elastic modulus of each of the bonding materials BD1 and BD4 is lower than that of the bonding material BD5 in the semiconductor device including the semiconductor chip CPH, and from another viewpoint, the silver (Ag) content of each of the bonding materials BD1 and BD4 is lower than that of the bonding material BD5. In this case, however, the semiconductor device (semiconductor package) including the semiconductor chip CPH does not include the semiconductor chips CPL and CPC, the die pads DPL and DPC, the metal plate MP2, the leads LD3, LD4, LD5a, LD5b, LD7, and LD8, the lead coupling portions LB3 and LB4, and the bonding materials BD2, BD3, BD6, and BD7.

Second Embodiment

FIG. 32 is a table in which the bonding materials BD1, BD2, BD3, BD4, BD5, BD6, and BD7 in each of the first embodiment and the second embodiment are summarized.

In the first embodiment, the low-elastic bonding material is applied to the bonding materials BD1, BD2, BD3, BD4, and BD6, and the high-elastic bonding material is applied to the bonding materials BD5 and BD7 as described above.

In the second embodiment, the low-elastic bonding material is applied to the bonding materials BD1, BD2, and BD3, and the high-elastic bonding material is applied to the bonding materials BD4, BD5, BD6, and BD7. Namely, in the second embodiment, the elastic modulus of each of the bonding materials BD1, BD2, and BD3 is lower than that of each of the bonding materials BD4, BD5, BD6, and BD7. From another viewpoint, in the second embodiment, the silver (Ag) content of each of the bonding materials BD1, BD2, and BD3 is lower than that of each of the bonding materials BD4, BD5, BDE, and BD7. Since the second embodiment is substantially the same as the first embodiment other than that, the repetitive description thereof will be omitted here.

In the second embodiment, the low-elastic bonding material is applied to the bonding materials BD1, BD2, and BD3 that bond the semiconductor chips CPH, CPL, and CPC to the die pads DPH, DPL, and DPC like the first embodiment described above. The reason why the low-elastic bonding material is applied to the bonding materials BD1, BD2, and BD3 in the second embodiment is the same as that in the first embodiment. Also in the second embodiment, the stress (strain) to be generated in the bonding materials BD1 and BD2 due to the difference in thermal expansion coefficient between the die pads DPH and DPL and the semiconductor chips CPH and CPL when the semiconductor chips CPH and CPL generate heat can be suppressed by reducing the elastic modulus of the bonding materials BD1 and BD2, and the occurrence of cracks in the bonding materials BD1 and BD2 can be suppressed like the first embodiment. Since the occurrence of cracks in the bonding materials BD1 and BD2 can be suppressed, the reliability of the semiconductor device PKG can be improved. In addition, also in the second embodiment, the low-elastic bonding material is preferably applied not only to the bonding materials BD1 and BD2 but also to the bonding material BD3 like the first embodiment described above. Consequently, the bonding material BD3 (BD3a) can be formed of the same bonding material as that of the bonding materials BD1 and BD2 (BD1a, BD2a), so that the manufacturing process of the semiconductor device PKG (more specifically, die bonding process) can be simplified and the manufacturing cost of the semiconductor device PKG can be reduced.

Also, the bonding area (corresponding to the planar area of the bonding material BD1) between the back surface electrode BEH of the semiconductor chip CPH and the die pad DPH is substantially the same as the area of the semiconductor chip CPH and is relatively large. Further, the bonding area (corresponding to the planar area of the bonding material BD2) between the back surface electrode BEL of the semiconductor chip CPL and the die pad DPL is substantially the same as the area of the semiconductor chip CPL and is relatively large. The large bonding area between the back surface electrode BEH of the semiconductor chip CPH and the die pad DPH functions to reduce the connection resistance between the back surface electrode BEH of the semiconductor chip CPH and the die pad DPH via the bonding material BD1. Also, the large bonding area between the back surface electrode BEL of the semiconductor chip CPL and the die pad DPL functions to reduce the connection resistance between the back surface electrode BEL of the semiconductor chip CPL and the die pad DPL via the bonding material BD2. Therefore, even when the low-elastic bonding material is used as the bonding material BD1, the connection resistance between the back surface electrode BEH of the semiconductor chip CPH and the die pad DPH via the bonding material BD1 can be easily suppressed, and even when the low-elastic bonding material is used as the bonding material BD2, the connection resistance between the back surface electrode BEL of the semiconductor chip CPL and the die pad DPL via the bonding material BD2 can be easily suppressed.

Meanwhile, the bonding materials BD4 and BD6 are bonding materials for bonding the metal plates MP1 and MP2 to the pads PDHS1 and PDLS1 of the semiconductor chips CPH and CPL. The bonding area (corresponding to the planar area of the bonding material BD4) between the metal plate MP1 and the pad PDHS1 of the semiconductor chip CPH is smaller than the bonding area (corresponding to the planar area of the bonding material BD1) between the back surface electrode BEH of the semiconductor chip CPH and the die pad DPH. Also, the bonding area (corresponding to the planar area of the bonding material BD6) between the metal plate MP2 and the pad PDLS1 of the semiconductor chip CPL is smaller than the bonding area (corresponding to the planar area of the bonding material BD2) between the back surface electrode BEL of the semiconductor chip CPL and the die pad DPL. Namely, the planar size (planar area) of each of the bonding materials BD4 and BD6 is smaller than the planar size (planar area) of each of the bonding materials BD1 and BD2. Accordingly, the connection resistance between the metal plate MP1 and the pad PDHS1 of the semiconductor chip CPH via the bonding material BD4 tends to be larger than the connection resistance between the back surface electrode BEH of the semiconductor chip CPH and the die pad DPH via the bonding material BD1. Also, the connection resistance between the metal plate MP2 and the pad PDLS1 of the semiconductor chip CPL via the bonding material BD6 tends to be larger than the connection resistance between the back surface electrode BEL of the semiconductor chip CPL and the die pad DPL via the bonding material BD2.

Thus, in the second embodiment, the high-elastic bonding material is applied to the bonding materials BD4 and BD6 with an emphasis on the reduction of the connection resistance between the metal plate MP1 and the pad PDHS1 of the semiconductor chip CPH via the bonding material BD4 and the connection resistance between the metal plate MP2 and the pad PDLS1 of the semiconductor chip CPL via the bonding material BD6. As described above, the high-elastic bonding material has a high silver content and thus has low electric resistivity (volume resistivity), and the electric resistivity (volume resistivity) of the bonding materials BD4 and BD6 can be reduced by using the high-elastic bonding material as the bonding materials BD4 and BD6. Consequently, the connection resistance between the metal plate MP1 and the pad PDHS1 of the semiconductor chip CPH via the bonding material BD4 and the connection resistance between the metal plate MP2 and the pad PDLS1 of the semiconductor chip CPL via the bonding material BD6 can be suppressed. As a result, the on resistance (resistance at conduction) of the semiconductor chip CPH (power MOSFET 1) and the on resistance (resistance at conduction) of the semiconductor chip CPL (power MOSFET 2) can be further reduced.

Also in the second embodiment, the high-elastic bonding material is applied to the bonding materials BD5 and BD7 like the first embodiment described above, and the reason for that is the seine as that of the first embodiment. Therefore, the repetitive description about the bonding materials BD5 and BD7 will be omitted here.

When an emphasis is placed on preventing occurrence of cracks in the bonding materials BD1, BD2, BD4, and BD6 due to the heat generation during the operation of the semiconductor chips CPH and CPL as much as possible and improving the reliability of the semiconductor device PKG as much as possible, the first embodiment described above (bonding materials BD1, BD2, BD4, and BD5 are low-elastic bonding materials) is advantageous. Meanwhile, when an emphasis is placed on reducing the connection resistance via the bonding material (specifically, reduction of on resistance of the semiconductor chips CPH and CPL) while securing the reliability of the semiconductor device PKG to some extent, the second embodiment (bonding materials BD1 and BD2 are low-elastic bonding materials and bonding materials BD4 and BD6 are high-elastic bonding materials) is advantageous.

Further, in the case of the second embodiment, the high-elastic bonding material is applied to the bonding materials BD4, BD5, BD6, and BD7 for bonding the metal plates MP1 and MP2, and thus the same (common) bonding material can be used for the bonding materials BD4, BD5, BD6, and BD7 for bonding the metal plates MP1 and MP2. Consequently, the manufacturing process of the semiconductor device PKG can be simply performed and the manufacturing cost of the semiconductor device can be reduced. Note that, when the same bonding material is used for the bonding materials BD4, BD5, BD6, and BD7, the elastic modulus of the bonding material BD4, the elastic modulus of the bonding material BD5, the elastic modulus of the bonding material BD6, and the elastic modulus of the bonding material BD7 are almost equal to one another.

In the foregoing, the invention made by the inventors of this application has been specifically described based on embodiments, but it goes without saying that the present invention is not limited to the embodiments described above and various modifications can be made without departing from the gist of the invention.

What is claimed is:

1. A semiconductor device comprising:
    a first semiconductor chip including a first field effect transistor for switching;
    a first chip mounting portion on which the first semiconductor chip is mounted via a first bonding material;
    a first lead electrically connected to a first pad for source of the first semiconductor chip through a first metal plate;
    a first metal portion formed integrally with the first lead; and
    a sealing body in which the first semiconductor chip, the first metal plate, the first metal portion, at least a part of the first chip mounting portion, and a part of the first lead are sealed,
    wherein a first back surface electrode for drain of the first semiconductor chip and the first chip mounting portion are bonded via the first bonding material,
    the first metal plate and the first pad for source of the first semiconductor chip are bonded via a second bonding material,
    the first metal plate and the first metal portion are bonded via a third bonding material,
    the first bonding material, the second bonding material, and the third bonding material have conductivity, and
    an elastic modulus of each of the first bonding material and the second bonding material is lower than that of the third bonding material.

2. The semiconductor device according to claim 1, further comprising:
    a second semiconductor chip including a second field effect transistor for switching;
    a second chip mounting portion on which the second semiconductor chip is mounted via a fourth bonding material;
    a second lead electrically connected to a second pad for source of the second semiconductor chip through a second metal plate; and
    a second metal portion formed integrally with the second lead,
    wherein the sealing body seals the second semiconductor chip, the second metal plate, the second metal portion, at least a part of the second chip mounting portion, and a part of the second lead, a second back surface electrode for drain of the second semiconductor chip and the second chip mounting portion are bonded via the fourth bonding material, the second metal plate and the second pad for source of the second semiconductor chip are bonded via a fifth bonding material, the second metal plate and the second metal portion are bonded via a sixth bonding material, the fourth bonding material, the fifth bonding material, and the sixth bonding material have conductivity, and an elastic modulus of each of the first bonding material, the second bonding material, the fourth bonding material, and the fifth bonding material is lower than that of each of the third bonding material and the sixth bonding material.

3. The semiconductor device according to claim 2, wherein the first field effect transistor is for a high-side switch, and the second field effect transistor is for a low-side switch.

4. The semiconductor device according to claim 3, further comprising:

a third semiconductor chip including a circuit configured to control each of the first semiconductor chip and the second semiconductor chip; and a third chip mounting portion on which the third semiconductor chip is mounted via a seventh bonding material, wherein the sealing body seals the third semiconductor chip and at least a part of the third chip mounting portion.

5. The semiconductor device according to claim 4, wherein an elastic modulus of the seventh bonding material is lower than that of each of the third bonding material and the sixth bonding material.

6. The semiconductor device according to claim 5, wherein the first bonding material, the second bonding material, the fourth bonding material, the fifth bonding material, and the seventh bonding material are made of the same bonding material, and the third bonding material and the sixth bonding material are made of the same bonding material.

7. The semiconductor device according to claim 6, wherein each of the first bonding material, the second bonding material, the third bonding material, the fourth bonding material, the fifth bonding material, the sixth bonding material, and the seventh bonding material is a silver paste bonding material.

8. The semiconductor device according to claim 7, wherein a silver content of each of the first bonding material, the second bonding material, the fourth bonding material, the fifth bonding material, and the seventh bonding material is lower than that of each of the third bonding material and the sixth bonding material.

9. The semiconductor device according to claim 5, wherein the elastic modulus of each of the first bonding material, the second bonding material, the fourth bonding material, the fifth bonding material, and the seventh bonding material is 1 to 3 GPa, and the elastic modulus of each of the third bonding material and the sixth bonding material is 10 to 20 GPa.

10. The semiconductor device according to claim 4, wherein the first metal plate, the second metal plate, the first metal portion, and the second metal portion are made of the same material.

11. The semiconductor device according to claim 4, wherein the first metal plate, the second metal plate, the first metal portion, and the second metal portion are made of copper or copper alloy.

12. The semiconductor device according to claim 4, wherein back surfaces of the first chip mounting portion, the second chip mounting portion, and the third chip mounting portion are exposed from the sealing body.

13. The semiconductor device according to claim 4, wherein each of the first lead and the second lead is plural in number, the first metal portion couples the plurality of first leads, and the second metal portion couples the plurality of second leads.

14. The semiconductor device according to claim 4, wherein the first semiconductor chip, the second semiconductor chip, and the third semiconductor chip are used to form an inverter circuit.

15. The semiconductor device according to claim 1, wherein the first metal plate and the first metal portion are made of the same material.

16. A semiconductor device comprising:

a first semiconductor chip including a first field effect transistor for switching;

a first chip mounting portion on which the first semiconductor chip is mounted via a first bonding material;

a first lead electrically connected to a first pad for source of the first semiconductor chip through a first metal plate;

a first metal portion formed integrally with the first lead; and a sealing body in which the first semiconductor chip, the first metal plate, the first metal portion, at least a part of the first chip mounting portion, and a part of the first lead are sealed, wherein a first back surface electrode for drain of the first semiconductor chip and the first chip mounting portion are bonded via the first bonding material, the first metal plate and the first pad for source of the first semiconductor chip are bonded via a second bonding material, the first metal plate and the first metal portion are bonded via a third bonding material, the first bonding material, the second bonding material, and the third bonding material have conductivity, each of the first bonding material, the second bonding material, and the third bonding material is a silver paste ponding material, and a silver content of each of the first bonding material and the second bonding material is lower than that of the third bonding material.

17. The semiconductor device according to claim 16, further comprising:

a second semiconductor chip including a second field effect transistor for switching;

a second chip mounting portion on which the second semiconductor chip is mounted via a fourth bonding material;

a second lead electrically connected to a second pad for source of the second semiconductor chip through a second metal plate; and a second metal portion formed integrally with the second lead, wherein the sealing body seals the second semiconductor chip, the second metal plate, the second metal portion, at least a part of the second chip mounting portion, and a part of the second lead, a second back surface electrode for drain of the second semiconductor chip and the second chip mounting portion are bonded via the fourth bonding material, the second metal plate and the second pad for source of the second semiconductor chip are bonded via a fifth bonding material, the second metal plate and the second metal portion are bonded via a sixth bonding material, the fourth bonding material, the fifth bonding material, and the sixth bonding material have conductivity, each of the fourth bonding material, the fifth bonding material, and the sixth bonding material is a silver paste bonding material, and a silver content of each of the first bonding material, the second bonding material, the fourth bonding material, and the fifth bonding material is lower than that of each of the third bonding material and the sixth bonding material.

18. The semiconductor device according to claim 17, further comprising:

a third semiconductor chip including a circuit configured to control each of the first semiconductor chip and the second semiconductor chip; and a third chip mounting portion on which the third semiconductor chip is mounted via a seventh bonding material, wherein the sealing body seals the third semiconductor chip and at least a part of the second chip mounting portion, the first field effect transistor is for a high-side switch, the second field effect transistor is for a low-side switch, the seventh bonding material is a silver paste bonding material, and a silver content of the seventh bonding material is lower than that of each of the third bonding material and the sixth bonding material.

19. A semiconductor device comprising:

a first semiconductor chip including a first field effect transistor for switching;

a first chip mounting portion on which the first semiconductor chip is mounted via a first bonding material;

a first lead electrically connected to a first pad for source of the first semiconductor chip through a first metal plate;

a first metal portion formed integrally with the first lead; and a sealing body in which the first semiconductor chip, the first metal plate, the first metal portion, at least a part of the first chip mounting portion, and a part of the first lead are sealed, wherein a first back surface electrode for drain of the first semiconductor chip and the first chip mounting portion are bonded via the first bonding material, the first metal plate and the first pad for source of the first semiconductor chip are bonded via a second bonding material, the first metal plate and the first metal portion are bonded via a third bonding material, the first bonding material, the second bonding material, and the third bonding material have conductivity, an elastic modulus of the first bonding material is lower than that of each of the second bonding material and the third bonding material, and a bonding area between the first metal plate and the first pad for source of the first semiconductor chip via the second bonding material is smaller than that between the first chip mounting portion and the first back surface electrode for drain of the first semiconductor chip via the first bonding material.

20. The semiconductor device according to claim 19, further comprising:

a second semiconductor chip including a second field effect transistor for switching;

a second chip mounting portion on which the second semiconductor chip is mounted via a fourth bonding material;

a second lead electrically connected to a second pad for source of the second semiconductor chip through a second metal plate; and a second metal portion formed integrally with the second lead, wherein the sealing body seals the second semiconductor chip, the second metal plate, the second metal portion, at least a part of the second chip mounting portion, and a part of the second lead, a second back surface electrode for drain of the second semiconductor chip and the second chip mounting portion are bonded via the fourth bonding material, the second metal plate and the second pad for source of the second semiconductor chip are bonded via a fifth bonding material, the second metal plate and the second metal portion are bonded via a sixth bonding material, the fourth bonding material, the fifth bonding material, and the sixth bonding material have conductivity, an elastic modulus of each of the first bonding material and the fourth bonding material is lower than that of each of the second bonding material, the third bonding material, the fifth bonding material, and the sixth bonding material, and a bonding area between the second metal plate and the second pad for source of the second semiconductor chip via the fifth bonding material is smaller than that between the second chip mounting portion and the second back surface electrode for drain of the second semiconductor chip via the fourth bonding material.

* * * * *